(12) United States Patent
Ando et al.

(10) Patent No.: US 8,932,889 B2
(45) Date of Patent: Jan. 13, 2015

(54) DISPLAY, METHOD OF MANUFACTURING THE SAME, AND ELECTRONIC UNIT

(71) Applicant: Sony Corporation, Tokyo (JP)

(72) Inventors: Makoto Ando, Kanagawa (JP); Tatsuya Matsumi, Kanagawa (JP); Toshiaki Imai, Kanagawa (JP); Tsutomu Mori, Kanagawa (JP)

(73) Assignee: Sony Corporation (JP)

( * ) Notice: Subject to any disclaimer, the term of this patent is extended or adjusted under 35 U.S.C. 154(b) by 0 days.

(21) Appl. No.: 13/867,747

(22) Filed: Apr. 22, 2013

(65) Prior Publication Data

US 2013/0244362 A1    Sep. 19, 2013

Related U.S. Application Data

(62) Division of application No. 13/600,550, filed on Aug. 31, 2012, now Pat. No. 8,723,168.

(30) Foreign Application Priority Data

Sep. 8, 2011  (JP) ................................. 2011-196399

(51) Int. Cl.
*H01L 29/72*   (2006.01)
*H01L 51/56*   (2006.01)
*H01L 51/00*   (2006.01)
*H01L 27/32*   (2006.01)

(52) U.S. Cl.
CPC ............ *H01L 51/56* (2013.01); *H01L 51/0004* (2013.01); *H01L 27/322* (2013.01)
USPC .......................................................... 438/34

(58) Field of Classification Search
CPC ...................................................... H01L 51/56
USPC .......................................................... 438/34
See application file for complete search history.

(56) References Cited

U.S. PATENT DOCUMENTS

2007/0228397 A1*  10/2007  Taninaka et al. ................ 257/88
2008/0017830 A1*   1/2008  Takeda ....................... 252/299.1

* cited by examiner

*Primary Examiner* — Edward Wojciechowicz
(74) *Attorney, Agent, or Firm* — Sheridan Ross P.C.

(57) ABSTRACT

A display includes: a first light-emitting device disposed in a first region on a substrate and including a transfer organic layer; a second light-emitting device disposed in a second region adjacent to the first region on the substrate and not including a transfer organic layer; and a level difference provided between the first region and the second region, and being large enough to inhibit transfer of the transfer organic layer to the second region when the transfer organic layer is formed in the first region.

10 Claims, 31 Drawing Sheets

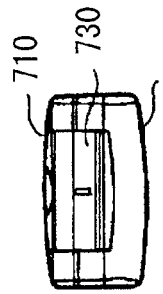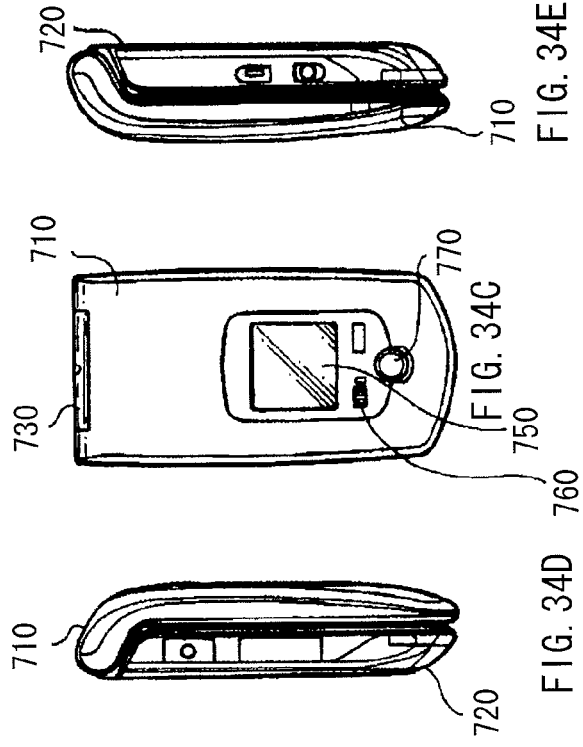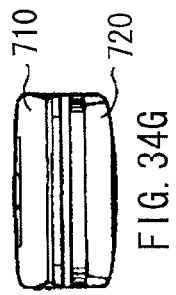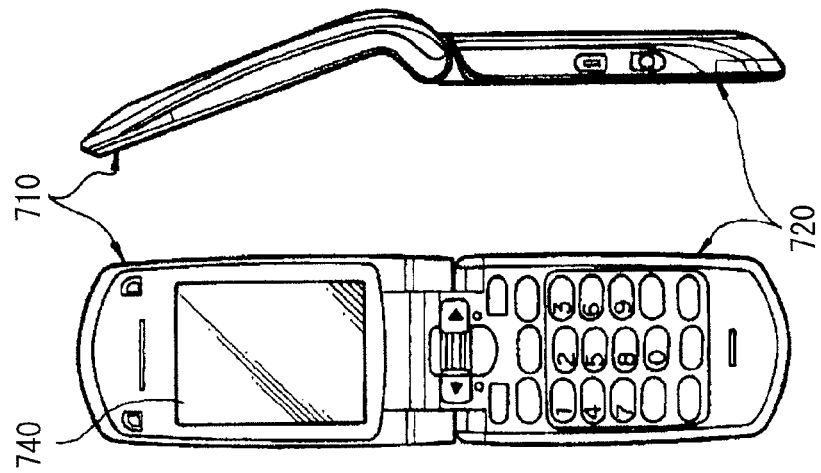

DISPLAY, METHOD OF MANUFACTURING THE SAME, AND ELECTRONIC UNIT

CROSS-REFERENCE TO RELATED APPLICATIONS

The present application is a divisional of U.S. patent application Ser. No. 13/600,550, filed Aug. 31, 2012, which claims priority from JP 2011-196399, filed Sep. 8, 2011, the entire contents of which are hereby incorporated herein by reference.

BACKGROUND

The present technology relates to a display, such as an organic EL display, including an organic layer formed by a printing method, a method of manufacturing the same, and an electronic unit.

In recent years, methods of forming a light-emitting layer (an organic layer) of an organic EL (Electroluminescence) display device by a printing method have been proposed (for example, refer to Japanese Unexamined Patent Application Publication Nos. 2007-95514, 2009-238709, and 2010-247394). The printing method holds promise, since, compared to a vacuum deposition method, process cost is lower and upsizing of displays is easier.

The printing method is broadly classified into a non-contact printing method and a contact printing method. Examples of the non-contact printing method include an ink-jet printing method and a nozzle printing method. These methods are specifically suitable for manufacturing of large-screen displays, and are superior in material use efficiency. However, there are issues such as an increase in cost since a bank for determining an ink coating position is necessary, and a non-uniform film thickness distribution in a device pixel caused by the spread of an ink to the bank.

On the other hand, examples of the contact printing method include a flexographic printing method, a gravure offset printing method, and a reverse offset printing method. In the flexographic printing method, a film is formed on a substrate with good film thickness accuracy, and operation time for a printing step is short; therefore, upsizing of a printing machine is possible. However, the flexographic printing method has low plate accuracy, and it is thus difficult for the flexiographic printing method to cope with higher-definition displays or larger-screen displays. The gravure offset printing method has high plate accuracy, and is thus capable of coping with higher-definition displays or larger-screen displays; however, a film thickness distribution in a pattern forms a mountain-like shape, thereby causing nonuniform light emission luminance in pixels.

The reverse offset printing method is a method of uniformly forming a film of an ink on a blanket, and then pressing the film to a plate to remove a non-printing portion of the film, and transferring a pattern formed of the film remaining on the blanket to an object where the pattern is to be printed. In this method, a film with a uniform film thickness is formed, and high-definition patterning is performed; therefore, this method is expected to be applied to a field called printed electronics. More specifically, applications of this method to not only organic layers of organic EL devices, but also wiring/insulating patterns of printed circuit boards, resists in photolithography operation, color filters for display, and organic layers of organic TFTs (Thin Film Transistors) have been studied.

SUMMARY

However, in the reverse offset printing method, as a plate for removing a non-printing portion is used, a step of cleaning the plate after every printing is necessary. In the reverse offset printing method, compared to other contact printing methods, cost is higher due to this step.

It is desirable to provide a display and a method of manufacturing the same which are capable of forming an organic layer at lower cost by eliminating a step of cleaning a plate while maintaining advantages of a reverse offset printing method, and an electronic unit.

According to an embodiment of the technology, there is provided a display including: a first light-emitting device disposed in a first region on a substrate and including a transfer organic layer; a second light-emitting device disposed in a second region adjacent to the first region on the substrate and not including a transfer organic layer; and a level difference provided between the first region and the second region, and being large enough to inhibit transfer of the transfer organic layer to the second region when the transfer organic layer is formed in the first region.

According to an embodiment of the technology, there is provided an electronic unit including a display, the display including: a first light-emitting device disposed in a first region on a substrate and including a transfer organic layer; a second light-emitting device disposed in a second region adjacent to the first region on the substrate and not including a transfer organic layer; and a level difference provided between the first region and the second region, and being large enough to inhibit transfer of the transfer organic layer to the second region when the transfer organic layer is formed in the first region.

According to an embodiment of the technology, there is provided a method of manufacturing a display including: forming a level difference between a first region and a second region on a substrate, the level difference being large enough to allow contact of a blanket with the first region and inhibit contact of the blanket with the second region; and transferring an organic film on the blanket, with use of the level difference, to the first region but not to the second region.

In the embodiment of the technology, when the blanket is pressed to the substrate to transfer the organic film to the first region, even if the organic film is in a solid film form (the organic film is not formed into a pattern), the organic film is not transferred to the second region by presence of the level difference between the first region and the second region.

In the display, the method of manufacturing a display, the electronic unit according to the embodiment of the technology, the level difference is provided between the first region and the second region; therefore, an organic layer is allowed to be formed in the first light-emitting device without use of a plate, and transfer of the organic film to the second region is allowed to be inhibited. Moreover, the organic layer is allowed to be formed by a method similar to a reverse offset printing method, except that the plate is not used. Therefore, the organic layer is allowed to be formed at lower cost while advantages of the reverse offset printing method are maintained.

It is to be understood that both the foregoing general description and the following detailed description are exemplary, and are intended to provide further explanation of the technology as claimed.

BRIEF DESCRIPTION OF THE DRAWINGS

The accompanying drawings are included to provide a further understanding of the technology, and are incorporated in and constitute a part of this specification. The drawings illustrate embodiments and, together with the specification, serve to explain the principles of the technology.

FIGS. 34A to 34G illustrate Application Example 5, where FIGS. 34A and 34B are a front view and a side view in a state in which Application Example 5 is opened, respectively, and FIGS. 34C, 34D, 34E, 34F, and 34G are a front view, a left side view, a right side view, a top view, and a bottom view in a state in which Application Example 5 is closed, respectively.

DETAILED DESCRIPTION OF THE PREFERRED EMBODIMENTS

Preferred embodiments of the technology will be described in detail below referring to the accompanying drawings. It is to be noted that description will be given in the following order.

1. First Embodiment (An example in which a level difference is provided in a planarization insulating film between a substrate, and first and second light-emitting devices)
2. Modification 1 (An example in which light emitted from the first light-emitting device is separated by the color filters into three colors (yellow, red, and green))
3. Modification 2 (An example in which the level difference is provided in a color filter between the substrate and the first and second light-emitting devices)
4. Second Embodiment (An example in which the level difference is provided in an opening insulating film of the second light-emitting device)
5. Modification 3 (An example in which the level difference is provided in each of a planarization insulating film and an opening insulating film)
6. Modification 4 (An example in which a lower electrode of the second light-emitting device is partitioned by an insulating material)

First Embodiment

Configuration of Display 1

Figure 1:
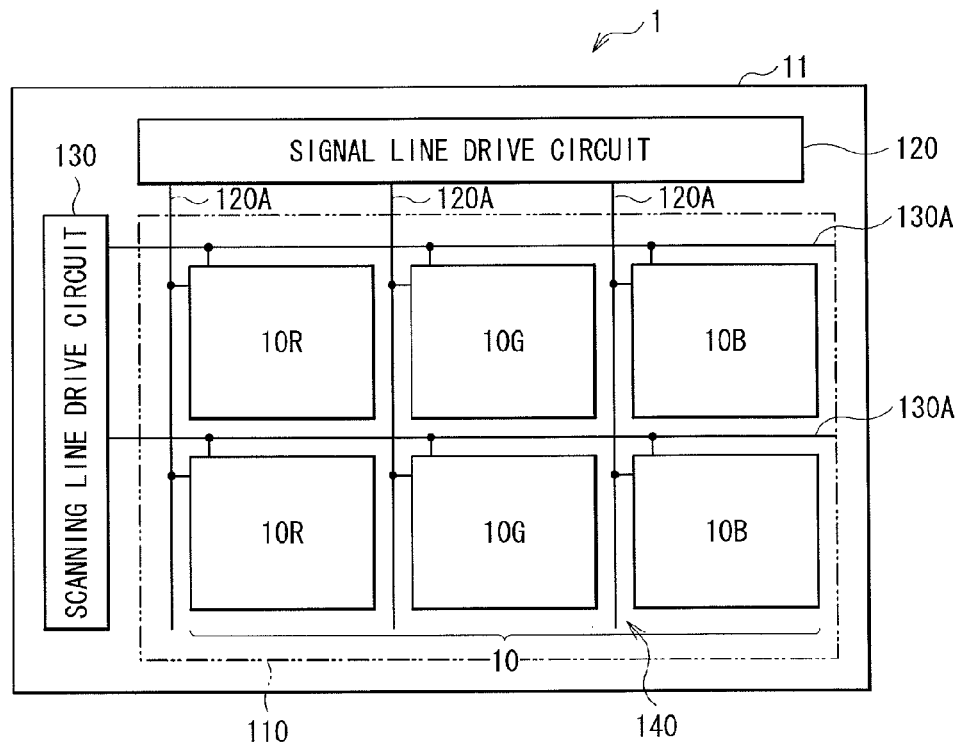
FIG. 1 is a diagram illustrating a configuration of a display according to a first embodiment of the technology.

FIG. 1 illustrates a configuration of a display (a display 1) according to a first embodiment of the technology. The display 1 is an organic EL (Electroluminescence) display, and includes, for example, a plurality of red organic EL devices 10R, a plurality of green organic EL devices 10G, and a plurality of blue organic EL devices 10B arranged in a matrix as a display region 110 on a substrate 11. One pixel 10 is configured of one red organic EL device 10R, one green organic EL device 10G, and one blue organic EL device 10B. The red organic EL device 10R and the green organic EL device 10G correspond to specific but not limitative examples of "a first light-emitting device" in the technology, and the blue organic EL device 10B corresponds to a specific but not limitative example of "a second light-emitting device" in the technology. A signal line drive circuit 120 and a scanning line drive circuit 130 as drivers for image display are arranged around the display region 110.

(Entire Configuration)

Figure 2:
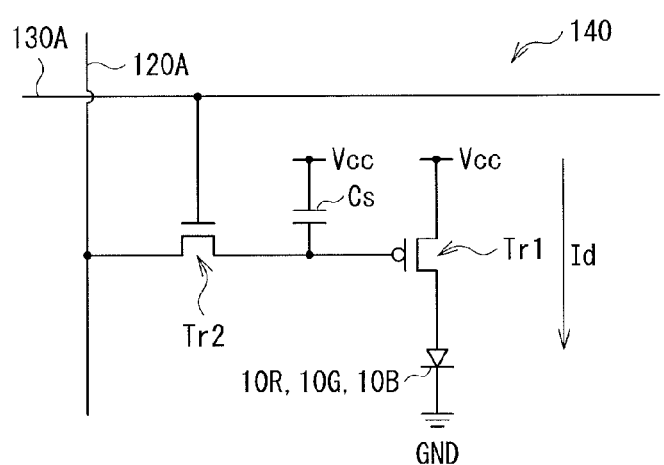
FIG. 2 is a diagram illustrating an example of a pixel drive circuit illustrated in FIG. 1.

A pixel drive circuit 140 is disposed in the display region 110. FIG. 2 illustrates an example of the pixel drive circuit 140. The pixel drive circuit 140 is an active drive circuit formed below a lower electrode 15 which will be described later. In other words, the pixel drive circuit 140 includes a driving transistor Tr1 and a writing transistor Tr2, a capacitor (retention capacitor) Cs between the driving transistor Tr1 and the writing transistor Tr2, and the red organic EL device 10R (or the green organic EL device 10G or the blue organic EL device 10B) connected to the driving transistor Tr1 in series between a first power source line (Vcc) and a second power source line (GND). The driving transistor Tr1 and the writing transistor Tr2 each are configured of a typical thin film transistor (TFT), and the TFT may have, for example, an inverted stagger configuration (a so-called bottom gate type) or a stagger configuration (a top gate type), and the configuration of the TFT is not specifically limited.

In the pixel drive circuit 140, a plurality of signal lines 120A are arranged in a column direction, and a plurality of scanning lines 130A are arranged in a row direction. An intersection of each signal line 120A and each scanning line 130A corresponds to one of the red organic EL device 10R, the green organic EL device 10G, and the blue organic EL device 10B. Each signal line 120A is connected to the signal line drive circuit 120, and an image signal is supplied from the signal line drive circuit 120 to a source electrode of the writing transistor Tr2 through the signal line 120A. Each scanning line 130A is connected to the scanning line drive circuit 130, and a scanning signal is sequentially supplied from the scanning line drive circuit 130 to a gate electrode of the writing transistor Tr2 through the scanning line 130A.

(Organic EL Devices)

Figure 3:
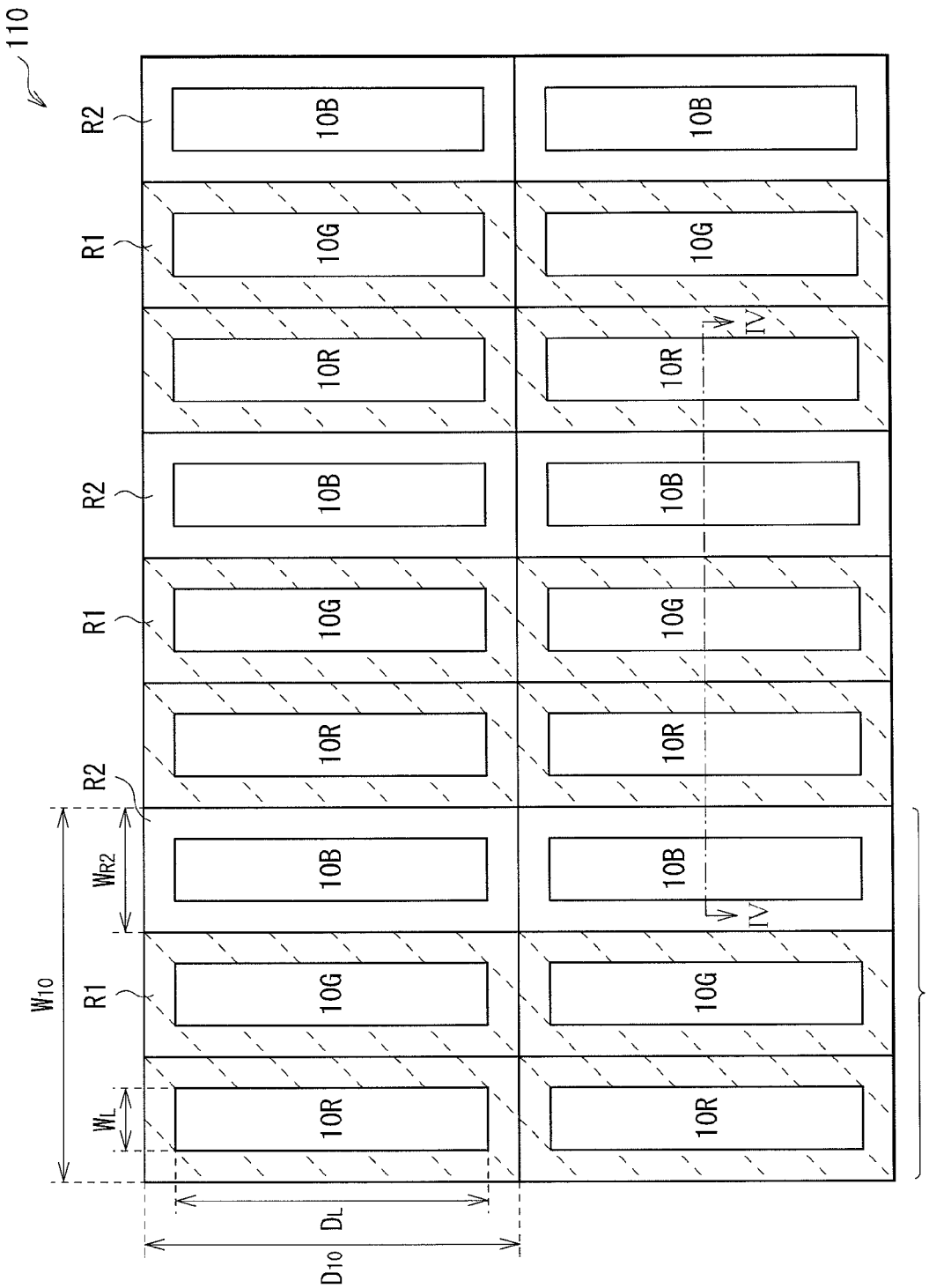
FIG. 3 is a plan view illustrating a configuration of a display region illustrated in FIG. 1.
Figure 4:
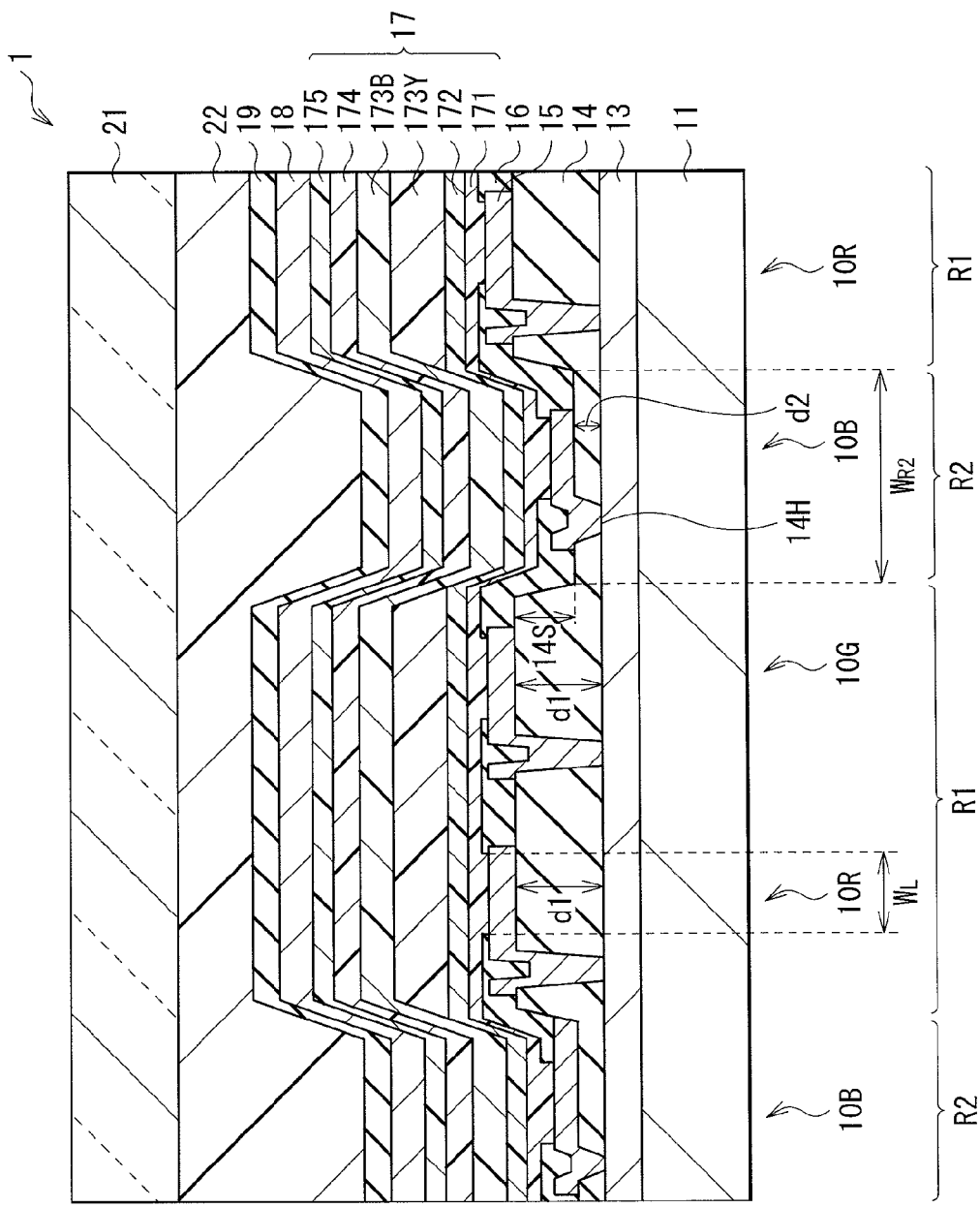
FIG. 4 is a sectional view taken along a line IV-IV of FIG. 3.

FIG. 3 illustrates a planar configuration of the display region 110 illustrated in FIG. 1, and FIG. 4 illustrates a sectional configuration taken along a line IV-IV of FIG. 3. As illustrated in FIG. 4, the red organic EL devices 10R, the green organic EL devices 10G, and the blue organic EL devices 10B each include the lower electrode 15 as an anode, an opening insulating film 16, an organic layer 17, and an upper electrode 18 as a cathode in this order from a side closer to the substrate 11. The organic layer 17 includes a hole injection layer 171, a hole transport layer 172, a yellow light-emitting layer 173Y (a transfer organic layer, a first light-emitting layer), a blue light-emitting layer 173B (a second light-emitting layer), an electron transport layer 174, and an electron injection layer 175 in order from a side closer to the lower electrode 15. In the red organic EL device 10R and the green organic EL device 10G which are adjacent to each other in the plan view, the yellow light-emitting layer 173Y and the blue light-emitting layer 173B are included as light-emitting layers, and in each blue organic EL device 10B, only the blue light-emitting layer 173B is included as the light-emitting layer. In other words, the red organic EL device 10R and the green organic EL device 10G which are adjacent to each other include a common light-emitting layer.

The red organic EL devices 10R, the green organic EL devices 10G, and the blue organic EL devices 10B are covered with a protective layer 19, and a sealing substrate 21 made of glass or the like is bonded to an entire surface of the protective layer 19 with an adhesive layer 22 made of a thermosetting resin, an ultraviolet curable resin, or the like in between. A TFT layer 13 (the driving transistor Tr1 of the pixel drive circuit 140) and a planarization insulating film 14 are disposed in this order from a side closer to the substrate 11 between the substrate 11, and the red organic EL devices 10R, the green organic EL devices 10G, and the blue organic EL devices 10B. The display 1 is a bottom-emission display in which light from the red organic EL devices 10R, the green organic EL devices 10G, and the blue organic EL device 10B is extracted from a side closer to the substrate 11. As described above, the red organic EL device 10R and the green organic EL device 10G which are adjacent to each other include the common light-emitting layer, but light extracted from the red organic EL device 10R and light extracted from the green organic EL device 10G pass through different color filters (not illustrated), for example, a red filter and a green filter to become different colors (red and green), respectively.

The substrate 11 is a supporting body with a flat surface where the red organic EL devices 10R, the green organic EL devices 10G, and the blue organic EL devices 10B are formed in an array. As the substrate 11, a known substrate, for example, quartz, glass, metal foil, or a film or a sheet made of a resin may be used. In particular, quartz or glass is preferably used. In the case where the substrate 11 is made of a resin, metacrylate resins typified by polymethyl methacrylate (PMMA), polyesters such as polyethylene terephthalate (PET), polyethylene naphthalate (PEN), and polybutylene naphthalate (PBN), polycarbonate resins, and the like may be used as the resin; however, the substrate 11 preferably has a laminate configuration subjected to surface treatment to reduce water permeability and gas permeability.

A color filter (not illustrated) includes red filters, green filters, and blue filters which are arranged to face the red organic EL devices 10R, the green organic EL devices 10G, and the blue organic EL devices 10B, respectively. The red filters, the green filters, and the blue filters each are made of a resin mixed with a pigment, and are capable of being adjusted by appropriately selecting the pigment to have high light transmittance in a target red, green, or blue wavelength range and low light transmittance in other wavelength ranges. As the blue organic EL devices 10B each include only the blue light-emitting layer 173B as the light-emitting layer, the blue organic EL devices 10B each may not include the blue filter.

The color filter includes a light-shielding film as a black matrix together with the red filters, the green filters, and the blue filters to extract light emitted from the red organic EL devices 10R, the green organic EL devices 10G, and the blue organic EL devices 10B and absorb outside light reflected by the red organic EL devices 10R, the green organic EL devices 10G, and the blue organic EL devices 10B, and wiring therebetween. Therefore, good contrast is obtained. The light-shielding film is configured of, for example, a black resin film mixed with a black colorant with an optical density of 1 or over, or a thin-film filter utilizing interference of a thin film. In particular, the light-shielding film is preferably configured of the black resin film, since the light-shielding film is allowed to be easily formed at low cost. The thin-film filter includes, for example, one or more thin films made of a metal, a metal nitride, or a metal oxide, and utilizes interference of the thin film to attenuate light. More specifically, as the thin-film filter, a thin-film filter formed by alternately laminating chromium (Cr) and chromium (III) oxide ($Cr_2O_3$) is allowed to be used.

The pixel drive circuit 140 is formed in the TFT layer 13, and the driving transistor Tr1 of the TFT layer 13 is electrically connected to the lower electrode 15. The planarization insulating film 14 planarizes a surface of the substrate 11 (the TFT layer 13) where the pixel drive circuit 140 is formed, and is preferably made of a material with high pattern accuracy, since a minute connection hole 14H allowing the driving transistor Tr1 and the lower electrode 15 to be connected to each other is formed in the planarization insulating film 14. Examples of the material of the planarization insulating film 12 include organic materials such as polyimide and inorganic materials such as silicon oxide ($SiO_2$).

In the embodiment, a thickness d1 of regions (first regions R1 which will be described later) corresponding to the red organic EL devices 10R and the green organic EL devices 10G and a thickness d2 of regions (second regions R2 which will be described later) corresponding to the blue organic EL devices 10B in the planarization insulating film 14 are different from each other, and a level difference 14S is formed by a difference between the thicknesses d1 and d2 (d1>d2). As will be described in detail later, the level difference 14S is large enough to inhibit contact of a blanket (a blanket 41 in FIG. 11) with regions corresponding to the blue organic EL devices 10B when the yellow light-emitting layer 173Y is formed; therefore, a yellow light-emitting film (a yellow light-emitting film 173' in FIG. 10) is transferred from the blanket to only the red organic EL devices 10R and the green organic EL devices 10G. The level difference 14S (d1−d2) is preferably 1/100 or over of a width $W_{R2}$ of the second region R2, and more preferably 500 nm or over to inhibit contact. For example, when a width $W_{10}$ and a length $D_{10}$ (a pitch) of the pixel 10 is 360 μm, widths of red, green, and blue sub-pixels each are 120 μm, and the width $W_{R2}$ of each second region R2 is 120 μm. At this time, when the level difference 14S (d1−d2) is 3 μm, contact of the blanket with regions where the blue organic EL devices 10B are formed is sufficiently inhibited.

The lower electrode 15 is disposed on the planarization insulating film 14 to correspond to each of the red organic EL devices 10R, the green organic EL devices 10G, and the blue organic EL devices 10B, and is made of, for example, a transparent material of a simple substance or an alloy of a metal element such as chromium (Cr), gold (Au), platinum (Pt), nickel (Ni), copper (Cu), tungsten (W), or silver (Ag). Alternatively, the lower electrode 15 may have a laminate configuration including a metal film and a transparent conductive film. The transparent conductive film is made of, for example, an oxide of indium and tin (ITO), indium zinc oxide (InZnO), or an alloy of zinc oxide (ZnO) and aluminum (Al). In the case where the lower electrode 15 is used as the anode, the lower electrode 15 is preferably made of a material with high hole injection properties. However, even if the lower electrode 15 is made of a material with an insufficient work function such as an aluminum alloy, the lower electrode 15 functions as the anode when the lower electrode 15 is provided with the appropriate hole injection layer 171.

The opening insulating film 16 secures insulation between the lower electrodes 15 and the upper electrode 18, and forms a light emission region into a desired shape. The opening insulating film 16 has an opening with a width $W_L$ and a length $D_L$ corresponding to a light emission region of each of the red organic EL devices 10R, the green organic EL devices 10G, and the blue organic EL devices 10B (refer to FIG. 3). For example, as described above, when the pitch of the pixel 10 is 360 μm the width $W_L$ is 60 μm, and the length $D_L$ is 280 μm. The opening insulating film 16 is made of an inorganic insulating material such as $SiO_2$. Alternatively, the opening insulating film 16 may be formed by laminating a layer of a photosensitive resin such as positive type photosensitive polybenzoxazole or a positive type photosensitive polyimide on the inorganic insulating material. Layers above the opening insulating film 16, that is, layers from the hole injection layer 171 to the upper electrode 18 may be disposed on not only the opening but also the opening insulating film 16; however, light is emitted from only the opening.

The hole injection layer 171 is provided as a common layer for the red organic EL devices 10R, the green organic EL devices 10G, and the blue organic EL devices 10B, and functions as a buffer layer for enhancing hole injection efficiency and preventing leakage. For example, the hole injection layer 171 is preferably formed with a thickness of 5 nm to 100 nm both inclusive, more preferably with a thickness of 8 nm to 50 nm both inclusive.

Examples of the material of the hole injection layer 171 include polyaniline and a derivative thereof, polythiophene and a derivative thereof, polypyrrole and a derivative thereof, polyphenylene and a derivative thereof, polythienylene vinylene and a derivative thereof, polyquinoline and a derivative thereof, polyquinoxaline and a derivative thereof, a conductive high polymer such as a polymer including an aromatic amine structure in a main chain or a side chain, metal phthalocyanine (such as copper phthalocyanine), and carbon, and the material of the hole injection layer 171 may be selected as appropriate depending on a relationship with the material of an electrode or an adjacent layer.

In the case where the hole injection layer 171 is made of a high-polymer material, the weight-average molecular weight (Mw) of the high-polymer material is, for example, within a range of approximately 2000 to 300000 both inclusive, and preferably within a range of approximately 5000 to 200000 both inclusive. In the case where the Mw is smaller than 5000, the hole injection layer 171 may be melted when the hole transport layer 172 and subsequent layers are formed. Moreover, in the case where the Mw is larger than 300000, the high-polymer material may be gelated to cause a difficulty in film formation.

Examples of a typical high-polymer material used for the hole injection layer 171 include polyaniline, oligoaniline, a combination of polyaniline and oligoaniline, and polydioxythiophene such as poly(3,4-ethylenedioxythiophene) (PEDOT). More specifically, for example, Nafion (trademark) and Liquion (trademark) manufactured from H. C. Starck GmbH, ELsource (trademark) manufactured from Nissan Chemical Industries. Ltd., a conductive polymer called Verazol (trademark) manufactured from Soken Chemical & Engineering Co., Ltd. or the like may be used.

The hole transport layer 172 enhances hole transport efficiency to the yellow light-emitting layers 173Y and the blue light-emitting layer 173B, and is disposed on the hole injection layer 171 as a common layer for the red organic EL devices 10R, the green organic EL devices 10G, and the blue organic EL devices 10B.

For example, the thickness of the hole transport layer 172, depending on an entire device configuration, is preferably within a range of 10 nm to 200 nm both inclusive, and more preferably within a range of 15 nm to 150 nm both inclusive. As the high-polymer material forming the hole transport layer 172, a light-emitting material which is soluble in an organic solvent, for example, polybinylcarbazole or a derivative thereof, polyfluorene or a derivative thereof, polyaniline or a detivative thereof, polysilane or a derivative thereof, a polysiloxane derivative having an aromatic amine in a side chain or a main chain, polythiophene or a derivative thereof, or polypyrrole may be used.

The weight-average molecular weight (Mw) of the high-polymer material is, for example, within a range of approximately 50000 to 300000 both inclusive, and in particular, preferably within a range of approximately 100000 to 200000 both inclusive. In the case where the Mw is smaller than 50000, when the light-emitting layer is formed, a low-molecular component in the high-polymer material drops out to cause dot defects in hole injection and transport layers, and accordingly, a decline in initial performance of organic EL devices or deterioration in the devices may occur. On the other hand, in the case where the Mw is larger than 300000, the high-polymer material may be gelated to cause a difficulty in film formation.

It is to be noted that the weight-average molecular weight (Mw) is a value obtained by determining a polystyrene-equivalent weight-average molecular weight by gel permeation chromatography (GPC) using tetrahydrofuran as a solvent.

The yellow light-emitting layer 173Y and the blue light-emitting layer 173B emit light by the recombination of electrons and holes in response to the application of an electric field. The yellow light-emitting layer 173Y is a common light-emitting layer for the red organic EL device 10R and the green organic EL device 10G which are adjacent to each other, and is not included in the blue organic EL devices 10B. For example, the thickness of the yellow light-emitting layer 173Y, depending on the entire device configuration, is preferably within a range of 10 nm to 200 nm both inclusive, and more preferably within a range of 15 nm to 100 nm both inclusive. The yellow light-emitting layer 173Y is made of one or more kinds of light-emitting materials having one or more peak wavelengths in a range of 500 nm to 750 nm both inclusive. The yellow light-emitting layer 173Y is made of, for example, a mixture material obtained by adding a low-molecular material (a monomer or an oligomer) to a high-polymer (light-emitting) material.

Examples of the high-polymer material of the yellow light-emitting layer 173Y include a polyfluorene-based high-polymer derivative, a (poly)paraphenylene vinylene derivative, a polyphenylene derivative, a polyvinylcarbazole derivative, a polythiophene derivative, a perylene-based pigment, a coumarin-based pigment, a rhodamine-based pigment, and the above-described high-polymer material doped with an organic EL material. As a doping material, for example, rubrene, perylene, 9,10-diphenylanthracene, tetraphenyl butadiene, nile red, or Coumarin6 may be used.

The blue light-emitting layer 173B is disposed as a common layer above the yellow light-emitting layer 173Y, and the hole transport layers 172 of the blue organic EL devices 10B. In other words, the blue light-emitting layer 173B is disposed as a common layer for the red organic EL devices 10R, the green organic EL devices 10G, and the blue organic EL devices 10B. The blue light-emitting layer 173B is made of, for example, an anthracene compound as a host material doped with, as a guest material, an organic light-emitting material such as a blue or green low-molecular fluorescent pigment, a phosphorescent pigment, or a metal complex.

The electron transport layer 174 enhances electron transport efficiency to the yellow light-emitting layer 173Y and the blue light-emitting layer 173B, and is disposed as a common layer on an entire surface of the blue light-emitting layer 173B. Examples of the material of the electron transport layer 174 include quinoline, perylene, phenanthroline, phenanthrene, pyrene, bisstyryl, pyrazine, triazole, oxazole, fullerene, oxadiazole, fluorenone, anthracene, naphthalene, butadiene, coumarin, acridine, stilbene, a derivative thereof, and a metal complex thereof. For example, tris(8-hydroxyquinoline) aluminum (Alq3 for short) may be used.

The electron injection layer 175 enhances electron injection efficiency, and is disposed as a common layer on an entire surface of the electron transport layer 174. As the material of the electron injection layer 175, lithium oxide ($Li_2O$) which is an oxide of lithium (Li), cesium carbonate ($Cs_2CO_3$) which is a complex oxide of cesium, or a mixture of the oxide and the complex oxide may be used. Moreover, as the material of the electron injection layer 175, a simple substance or an alloy of an alkaline-earth metal such as calcium (Ca) or barium (Ba), an alkali metal such as lithium or cesium, a metal with a small work function such as indium (In) or magnesium may be used, and a simple substance or a mixture of an oxide, a complex oxide, or a fluoride of any of these metals may be used.

The upper electrode 18 is disposed on an entire surface of the electron injection layer 175 while being insulated from the lower electrode 15. In other words, the upper electrode 18 is a common electrode for the red organic EL devices 10R, the green organic EL devices 10G, and the blue organic EL devices 10B. The upper electrode 18 is made of, for example, aluminum (Al) with a thickness of 200 nm.

(Protective Layer and Sealing Substrate)

The protective layer 19 may be made of an insulating material or a conductive material, and has, for example, a thickness of 2 μm to 3 μm both inclusive. For example, an inorganic amorphous insulating material such as amorphous silicon (α-silicon), amorphous silicon carbide (α-SiC), amorphous silicon nitride ($\alpha Si_{1-x}N_x$), or amorphous carbon (α-C) may be used. As such an inorganic amorphous insulating material does not form grains, the inorganic amorphous insulating material forms a good protective film with low water permeability.

The sealing substrate 21 is located closer to the upper electrode 18 of the red organic EL devices 10R, the green organic EL devices 10G, and the blue organic EL devices 10B, and seals, together with the adhesive layer 22, the red organic EL devices 10R, the green organic EL devices 10G, and the blue organic El devices 10B. The sealing substrate 21 is made of glass or the like. In the display 1, the color filter (not illustrated) is provided on a side closer to the substrate 11; however, in a top-emission display, a color filter substrate may be used as the sealing substrate 21.

[Method of Manufacturing Display 1]

Figure 5:
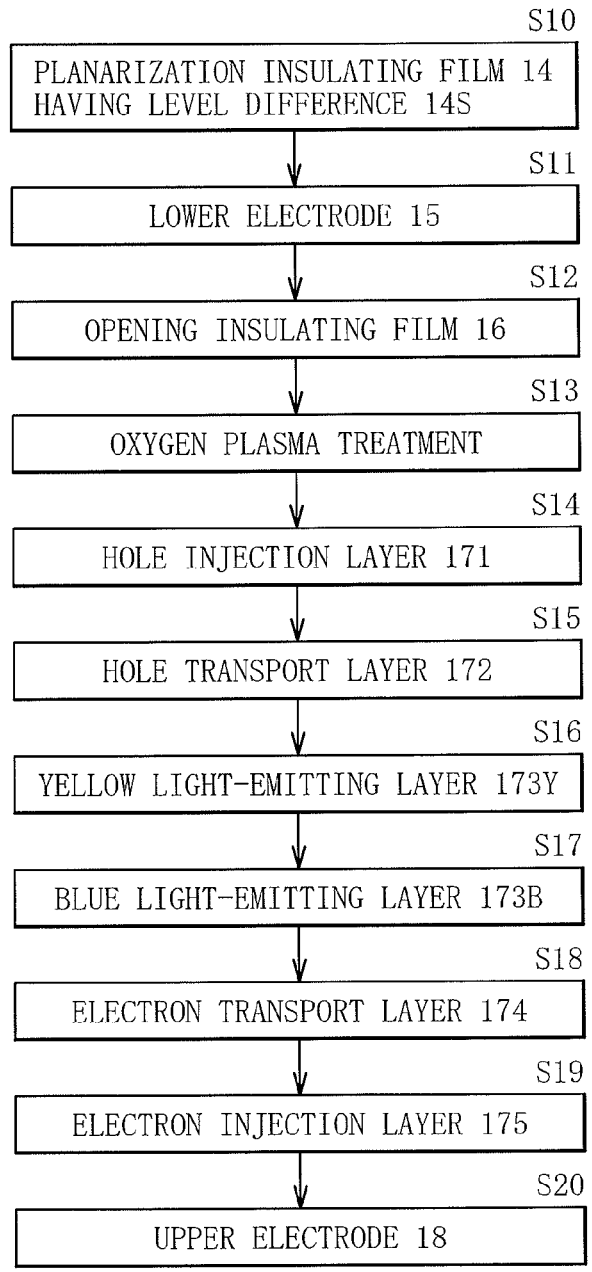
FIG. 5 is a flow chart illustrating a method of manufacturing the display illustrated in FIG. 1.

FIG. 5 illustrates a flow of a method of manufacturing the display 1 according to the embodiment. Steps of the method will be described below in order.

(Step of Forming Planarization Insulating Film 14)

First, the TFT layer 13 (the pixel drive circuit 140 including the driving transistor Tr1) is formed on the substrate 11 made of the above-described material. Next, the planarization insulating film 14 having the level difference 14S is formed (step S10). The level difference 14S (d1−d2) is, for example, 3 μm, where the thickness of regions (the first regions R1) where the red organic EL devices 10R and the green organic EL devices 10G are formed is d1, and the thickness of regions (the second regions R2) where the blue organic EL devices 10B are formed is d2 (d1>d2).

Figure 6:
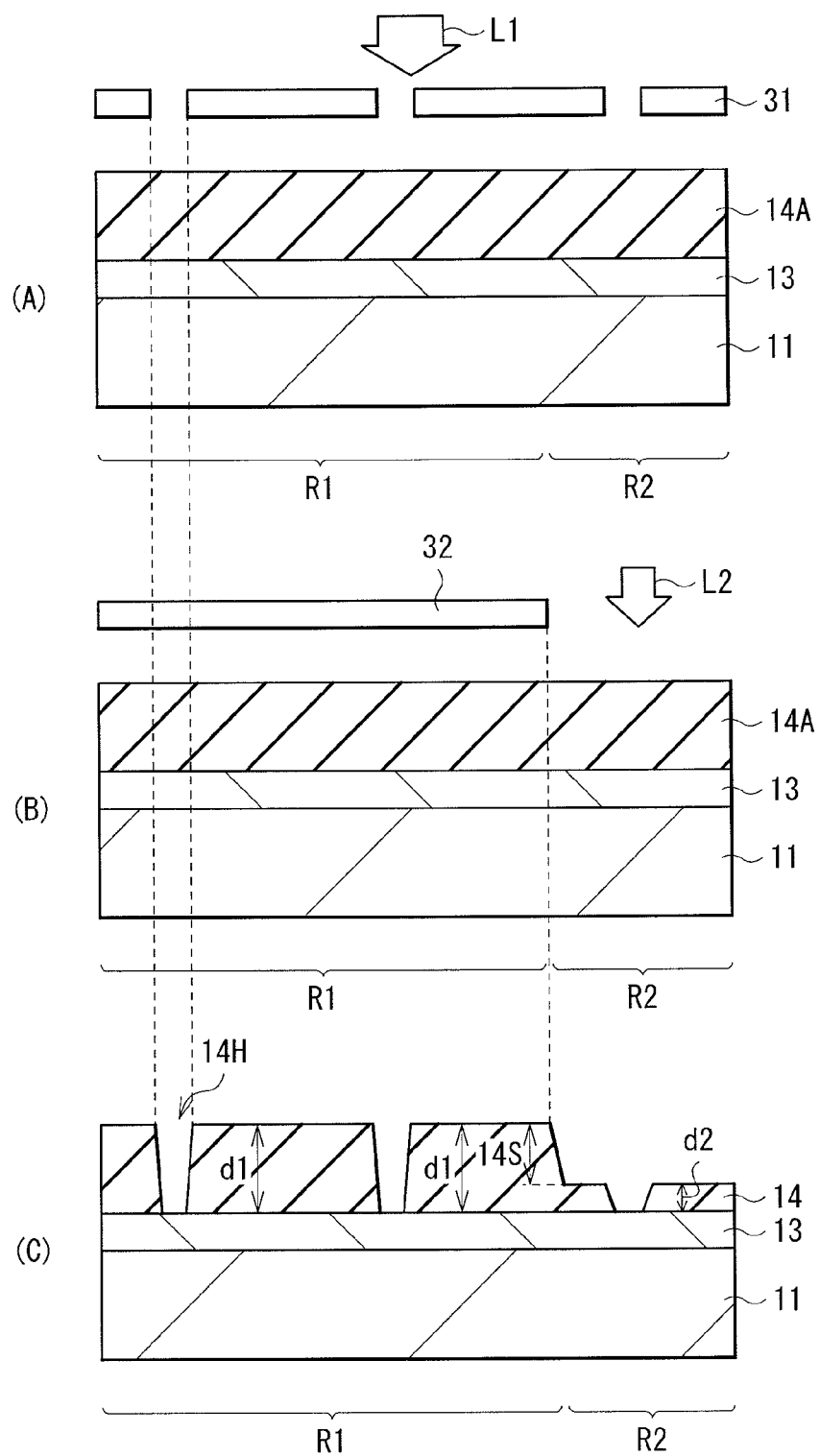
FIG. 6 is a sectional view illustrating a method of forming a planarization insulating film illustrated in FIG. 4.

FIG. 6 illustrates a specific method of forming the planarization insulating film 14 having the level difference 14S. First, as illustrated in a part (A) in FIG. 6, for example, an insulating film 14A made of photosensitive polyimide is provided on the TFT layer 13, and then the insulating film 14A is exposed to light (L1) with use of a mask 31 having an opening in a portion corresponding to each connection hole 14H. Next, as illustrated in a part (B) in FIG. 6, the insulating film 14A is half-exposed to light (L2) with use of a mask 32 having an opening in a portion corresponding to each second region R2. Then, when development is performed, as illustrated in a part (C) in FIG. 6, the planarization insulating film 14 having the level difference 14S is formed.

(Step of Forming Lower Electrode 15)

After the planarization insulating film 14 is formed, a transparent conductive film made of, for example, ITO is formed on an entire surface of the substrate 11, and the conductive film is patterned to form the lower electrode 15 (step S11). At this time, the lower electrode 15 is brought into conduction to a drain electrode of the driving transistor Tr1 (the TFT layer 13) through the connection hole 14H.

(Step of Forming Opening Insulating Film 16)

Next, a film of an inorganic insulating material such as $SiO_2$ is formed on the planarization insulating film 14 and the lower electrode 15 by, for example, CVD (Chemical Vapor Deposition), and then a photosensitive resin is laminated on the film, and patterning is performed on the photosensitive resin to form the opening insulating film 16 (step S12).

After the opening insulating film 16 is formed, a surface where the lower electrode 15 and the opening insulating film 16 are formed of the substrate 11 is subjected to oxygen plasma treatment to remove a contaminant such as an organic matter adhered to the surface, thereby improving wettability (step S13). More specifically, the substrate 11 is heated at a predetermined temperature, for example, approximately 70 to 80° C., and then is subjected to plasma treatment ($O_2$ plasma treatment) using oxygen as a reactive gas under atmospheric pressure.

(Step of Forming Hole Injection Layer 171 and Hole Transport Layer 172)

After the plasma treatment is performed, the hole injection layer 171 and the hole transport layer 172 which are made of the above-described materials are formed as common layers for the red organic EL devices 10R, the green organic EL devices 10G, and the blue organic EL devices 10B (steps S14 and S15). A film of the above-described material of the hole injection layer 171 is formed on the lower electrode 15 and the opening insulating film 16 by, for example, a spin coating method, and then is baked for one hour in the air to form the hole injection layer 171. After the hole injection layer 171 is formed, a film of the above-described material of the hole transport layer 172 is formed by a spin coating method in a like manner, and then is baked for 1 hour at 180° C. in a nitrogen ($N_2$) atmosphere.

(Step of Forming Yellow Light-Emitting Layer 173Y)

After the hole transport layer 172 is formed, the yellow light-emitting layer 173Y is formed on the hole transport layer 172 of each of the red organic EL devices 10R and the green organic EL devices 10G (step S16). In the display 1 according to the embodiment, as the level difference 14S is provided in the planarization insulating film 14, the yellow light-emitting layer 173Y is allowed to be formed by a printing method without use of a plate (for example, a plate 49 in FIG. 7 which will be described later). Now, description will be given of the printing method with use of a comparative example.

Figure 7:
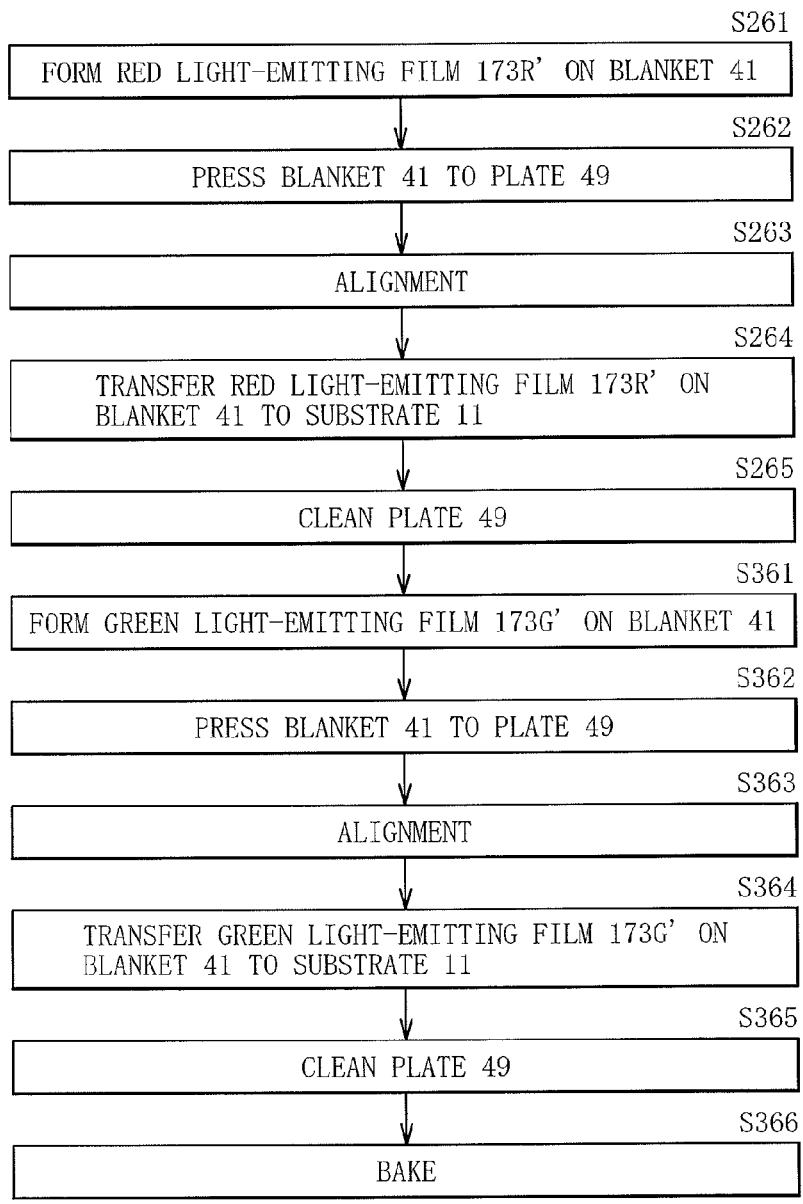
FIG. 7 is a flow chart illustrating steps of forming a light-emitting layer according to a comparative example.
Figure 8A:
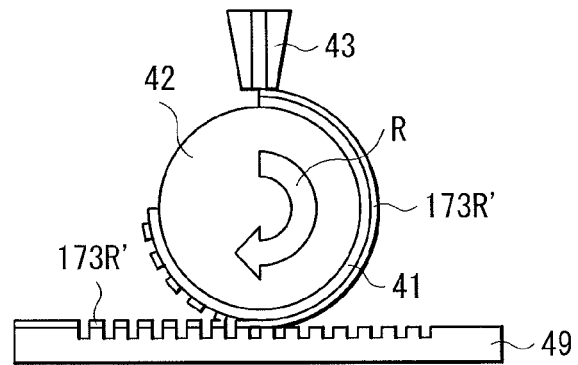
FIGS. 8A and 8B are sectional views illustrating steps illustrated in FIG. 7 in order.
Figure 8B:
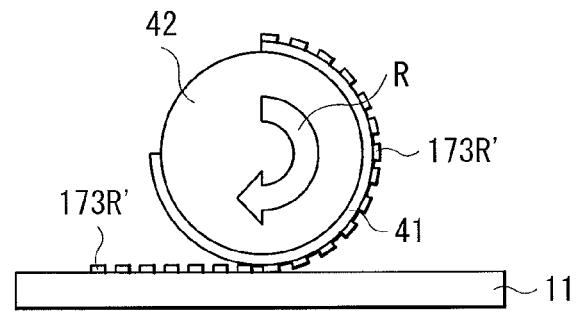
Figure 9:
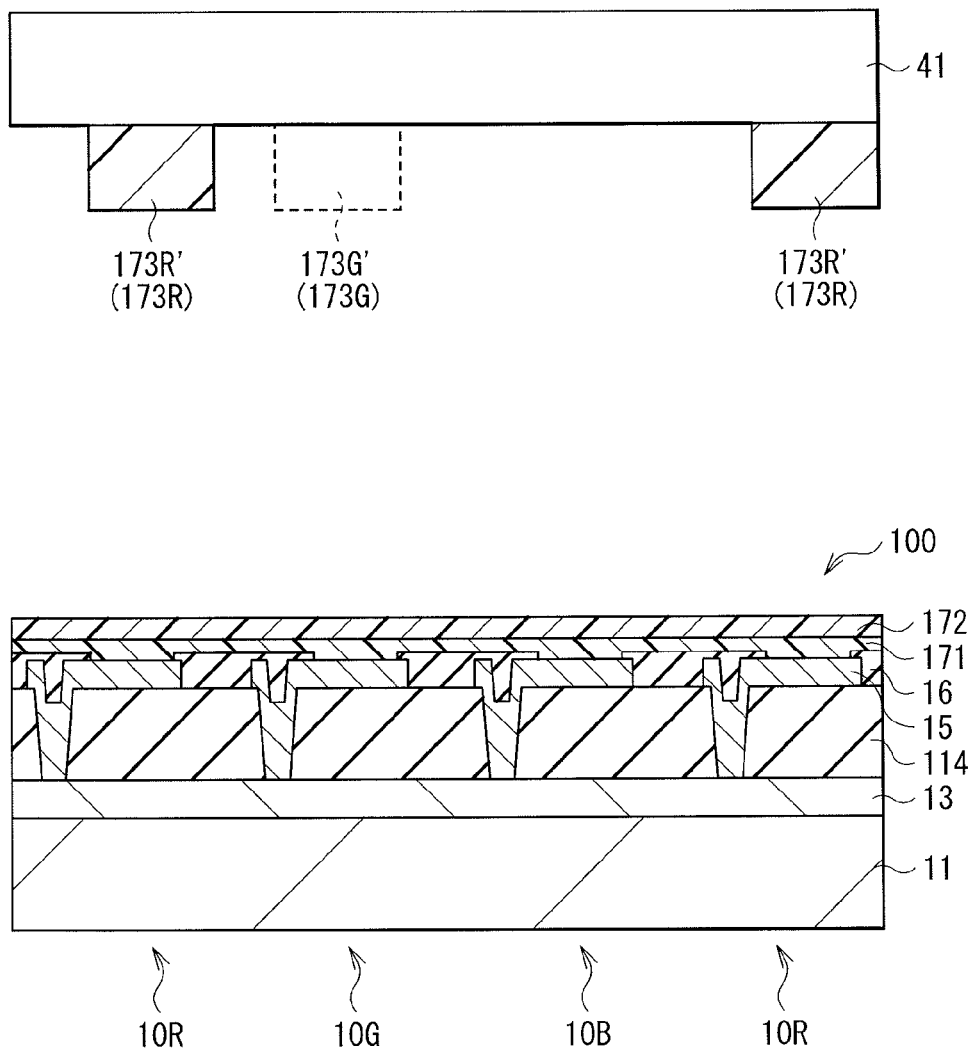
FIG. 9 is an enlarged partial view of a transferring step illustrated in FIGS. 8A and 8B.

FIG. 7 illustrates a flow of a step of forming light-emitting layers (a red light-emitting layer and a green light-emitting layer) of a display (a display 100) according to a comparative example. FIGS. 8A and 8B illustrate sectional configurations of the step, and FIG. 9 is an enlarged view of a part of FIG. 8B. A planarization insulating film 114 of the display 100 does not have a level difference, and a red light-emitting layer 173R and a green light-emitting layer 173G are formed for each red organic EL device 10R and each green organic EL device 10G, respectively, by a printing method (a reverse offset printing method) with use of the plate 49 (refer to FIG. 9). In other words, in the display 100, instead of the yellow light-emitting layer 173Y, the red light-emitting layer 173R and the green light-emitting layer 173G are included.

First, for example, the blanket 41 (STD700 manufactured from Fujikura Rubber Ltd.) with a surface made of silicon rubber is wrapped around and fixed to a cylindrical roll 42, and then the blanket 41 is uniformly covered with a material obtained by dissolving a material of the red light-emitting layer 173R in an organic solvent by a slit coat 43. Accordingly, a red light-emitting film 173R' in a solid film form is formed on the blanket 41 (step S261). In the display 100, the planarization insulating film 114 does not have the level difference, and it is necessary to transfer the red light-emitting film 173R' which is formed into a pattern. Therefore, after the red light-emitting film 173R' in a solid film form is formed on the blanket 41, the red light-emitting film 173R' is pressed to the plate 49 having a depression with a predetermined pattern (step S262) to form the red light-emitting film 173R' on the blanket 41 into a pattern (refer to FIG. 8A). Next, as illustrated in FIG. 8B, the red light-emitting film 173R' formed into the pattern is accurately aligned with respect to the substrate 11 (step S263), and then the roll 42 is rotated in a direction of an arrow R to perform transfer (step S264). As a portion removed when the pattern is formed on the blanket 41 of the red light-emitting film 173R' is adhered to the plate 49, the plate 49 is cleaned and dried by a plate cleaning unit (not illustrated) (step S265). Thus, the red light-emitting film 173R' formed into the pattern is provided on the substrate 11, and then a green light-emitting film 173G' formed into a pattern is transferred to the substrate 11 in a like manner (step S361 to S365), and the red light-emitting film 173R' and the green light-emitting film 173G' are baked (step S366) to form the red light-emitting layer 173R and the green light-emitting layer 173G.

Figure 10:
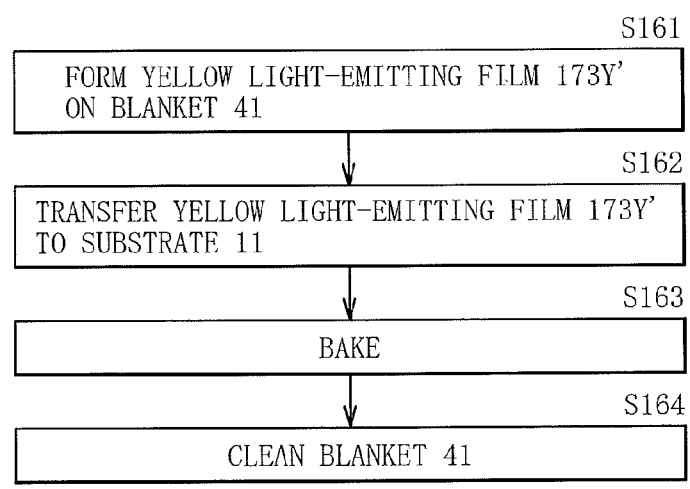
FIG. 10 is a flow chart specifically illustrating steps of forming a yellow light-emitting layer illustrated in FIG. 5.
Figure 11:
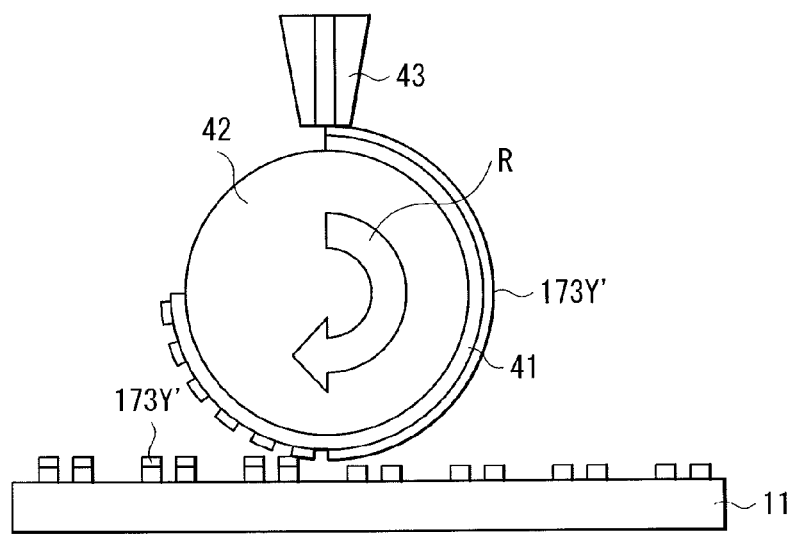
FIG. 11 is a sectional view illustrating a step illustrated in FIG. 10.

On the other hand, FIG. 10 illustrates a flow of a step of forming the yellow light-emitting layer 173Y according to the embodiment. FIG. 11 illustrates a schematic sectional view of a printing step at this time. First, as in the case of the above-described comparative example, a yellow light-emitting film 173Y' in a solid film form is formed on the blanket 41 (step S161). The yellow light-emitting film 173Y' may be formed by, for example, a spin coating method without use of the slit coat 43. As the planarization insulating film 14 has the level difference 14S, the yellow light-emitting film 173Y' in the solid film form is allowed to be transferred to the substrate 11 without use of the plate 49 (step S162).

Figure 12:
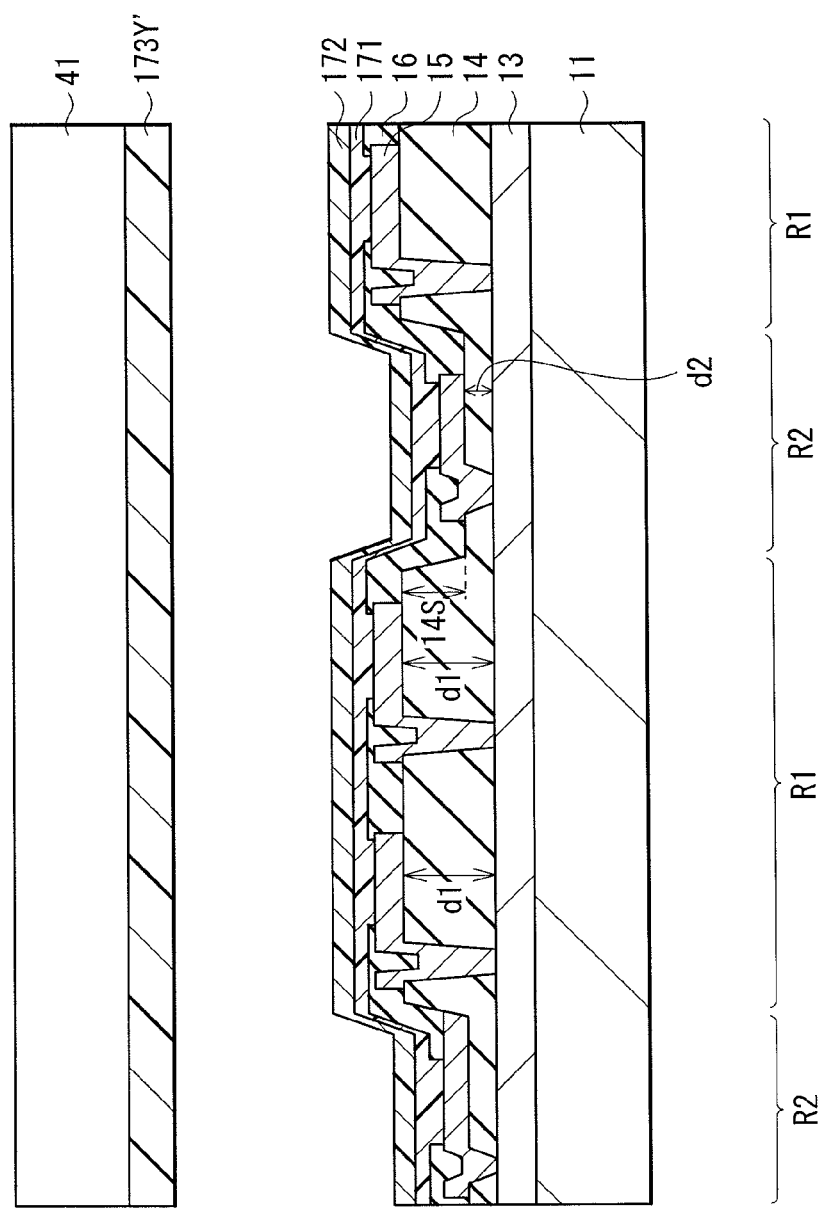
FIG. 12 is an enlarged partial view of a transferring step illustrated in FIG. 11.

FIG. 12 is an enlarged view of a portion where the substrate 11 and the blanket 41 face each other in FIG. 11. In the embodiment, as the planarization insulating film 14 has the level difference 14S (d1–d2), a level difference is formed between each of the regions (the first regions R1) corresponding to the red organic EL devices 10R and the green organic EL devices 10G of the hole transport layer 172 and each of the regions (the second regions R2) corresponding to the blue organic EL devices 10B of the hole transport layer 172. Therefore, when the blanket 41 is brought into contact with the substrate 11, the yellow light-emitting film 173Y' comes into contact with the first regions R1 of the hole transport layer 172, and on the other hand, gaps are formed between the yellow light-emitting film 173Y' and the second regions R2 of the hole transport layer 172. In other words, the yellow light-emitting film 173Y' is not transferred to the blue organic EL devices 10B, and is transferred to only the red organic EL devices 10R and the green organic EL devices 10G. The yellow light-emitting film 173Y' provided on the red organic EL devices 10R and the green organic EL devices 10G is baked, for example, for 20 minutes at 130° C. in a nitrogen atmosphere (step S163) to be dried, thereby forming the yellow light-emitting layer 173Y.

Thus, in the embodiment, as the level difference 14S is provided in the planarization insulating film 14, the yellow light-emitting layer 173Y is allowed to be formed without use of the plate. Therefore, a step of cleaning the plate is eliminated, and cost is reduced accordingly. Moreover, foreign matter contamination from the plate is inhibited. Further, a more accurate plate or a larger plate is not necessary; therefore, this printing method is applicable to a wide range including high-definition small-screen panels to large-screen panels.

Although methods of forming a pattern on the blanket 41 without use of the plate have been studied (for example, refer to Japanese Unexamined Patent Application Publication Nos. 2007-95514 and 2009-238709), it is difficult to put these methods into practical use due to securing of a film thickness and complexity in operation steps. Moreover, in the blanket with a surface made of silicon rubber (surface energy of approximately 20 mN/m), a liquid may be repelled after pattern formation to cause variations in pattern shape such as line thinning. In the embodiment, as the yellow light-emitting film 173Y' in a solid film form is brought into contact with the substrate 11, the printing method is simple and is allowed to be easily put into practical use, and there is no possibility that variations in pattern shape on the blanket 41 occur.

Moreover, as described above, when the red light-emitting film 173R' (the green light-emitting film 173G') formed into a pattern is transferred, accurate alignment is necessary in the comparative example. On the other hand, in the embodiment, as the yellow light-emitting film 173Y' in a solid film form is brought into contact with the substrate 11, alignment is not necessary, and operation time is further reduced.

In addition, in the case where the planarization insulating film 14 does not have the level difference 14S (refer to FIG. 9), when the blanket 41 is brought into contact with the substrate 11, the blanket 41 may come into contact with a region other than devices which are supposed to be subjected to transfer. This contact may cause a physical or chemical change in the red organic EL devices 10R, the green organic EL devices 10G, and the blue organic EL devices 10B, thereby causing a decline in light emission characteristics. The chemical change is caused by, for example, adhesion of low-molecular siloxane included in silicon rubber of the blanket 41 to the organic layer 17. In the embodiment, as the level difference 14S is formed, contact of the blanket 41 with the hole transport layer 172 of each blue organic EL device 10B is inhibited.

Moreover, in the embodiment, the yellow light-emitting layer 173Y is provided as a common layer for the red organic EL device 10R and the green organic EL device 10G. In the case where the red light-emitting layer 173R and the green light-emitting layer 173G are formed for the red organic EL device 10R and the green organic EL device 10G, respectively (refer to FIG. 7), printing is performed twice. However, in the embodiment, as printing is performed only once, operation time is further reduced.

Figure 13A:
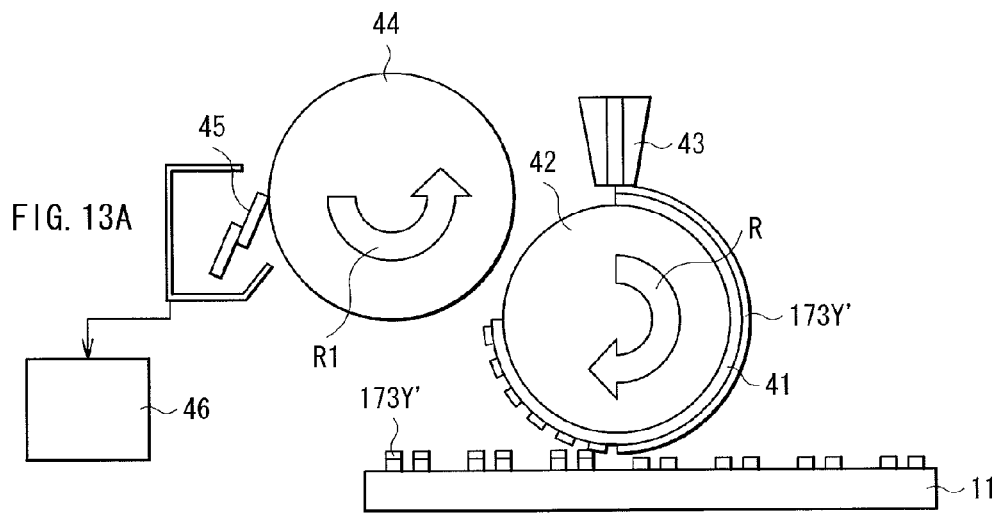
FIGS. 13A and 13B are sectional views illustrating steps following the step illustrated in FIG. 11.
Figure 13B:
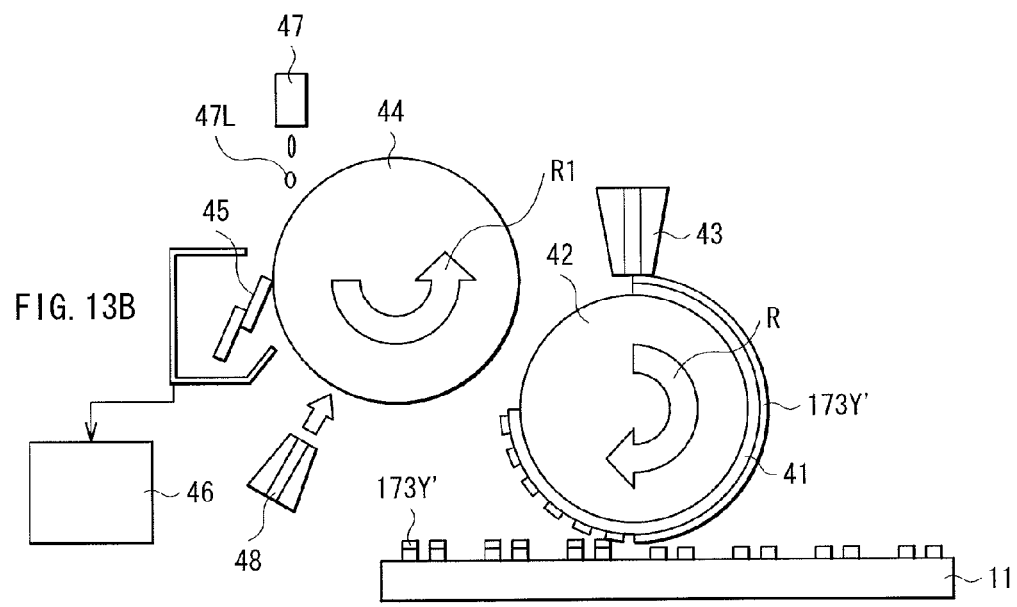

A non-transferred portion of the yellow light-emitting film 173Y' remains on the blanket 41 after forming the yellow light-emitting layer 173Y on the substrate 11; therefore, the blanket 41 is cleaned (step S164 in FIG. 10). FIGS. 13A and 13B illustrate an example of a cleaning method. As illustrated in FIG. 13A, a cleaning roll 44 is rotated in a direction of an arrow R1 (R1≠R) to bring the cleaning roll 44 and the roll 42 into contact with each other. Accordingly, the non-transferred portion remaining on the blanket 41 of the yellow light-emitting film 173Y' is removed to be transferred to the cleaning roll 44. The yellow light-emitting film 173Y' on the cleaning roll 44 is scraped off by a cleaning blade 45, and is collected in a tank 46. The material of the yellow light-emitting film 173Y' collected in the tank 46 is reusable. Moreover, in addition to the above-described method, as illustrated in FIG. 13B, a wash fluid discharge section 47 may be provided to supplementarily use a wash fluid 47L, and the cleaning roll 44 may be dried by an air injector 48.

Figure 14:
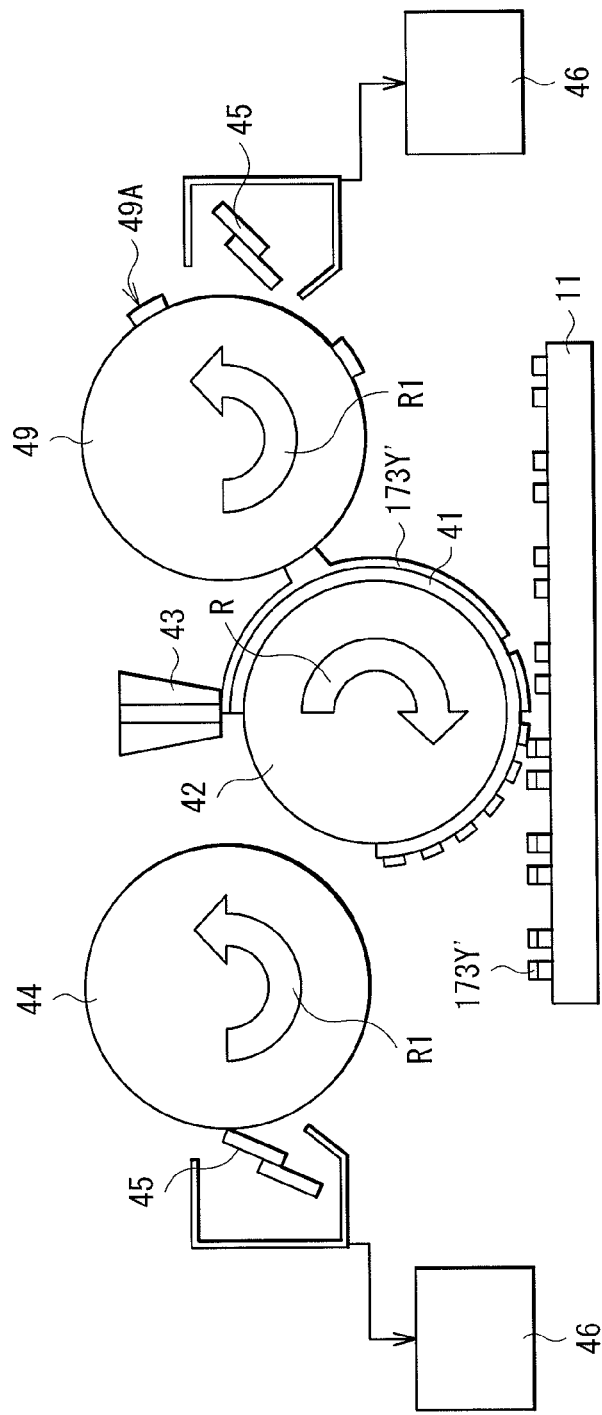
FIG. 14 is a sectional view illustrating a modification of the steps illustrated in FIGS. 13A and 13B.
Figure 15:
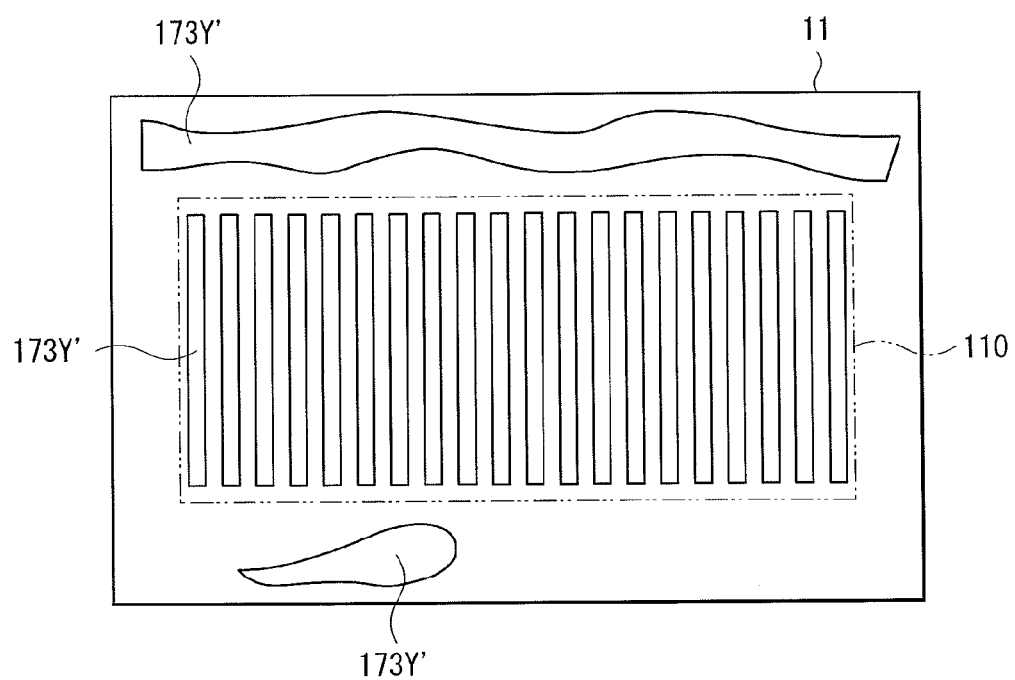
FIG. 15 is a diagram for describing a preprocessing roll illustrated in FIG. 14.

Further, as illustrated in FIG. 14, a preprocessing roll 49 may be provided together with the cleaning roll 44. The preprocessing roll 49 removes the non-transferred portion of the yellow light-emitting film 173Y' before the yellow light-emitting film 173Y' is transferred. For example, in the case where the yellow light-emitting film 173Y' is provided on the entire blanket 41, as illustrated in FIG. 15, the yellow light-emitting film 173Y' may be transferred to a region other than the display region 110. The preprocessing roll 49 removes, in advance, the yellow light-emitting film 173Y' which is to be transferred to the region other than the display region 110. The preprocessing roll 49 has a cylindrical shape, and has a projection 49A on its surface. When the preprocessing roll 49 is rotated in a direction of the arrow R1, the projection 49A is brought into contact with the blanket 41, and a portion in contact with the projection 49A of the yellow light-emitting film 173Y' is transferred to the preprocessing roll 49 to remove an unnecessary portion. The removed yellow light-emitting film 173Y' is scraped off by the cleaning blade 45, and is collected in the tank 46. The projection 49A may be formed by wrapping of an etched stainless sheet.

Figure 16:
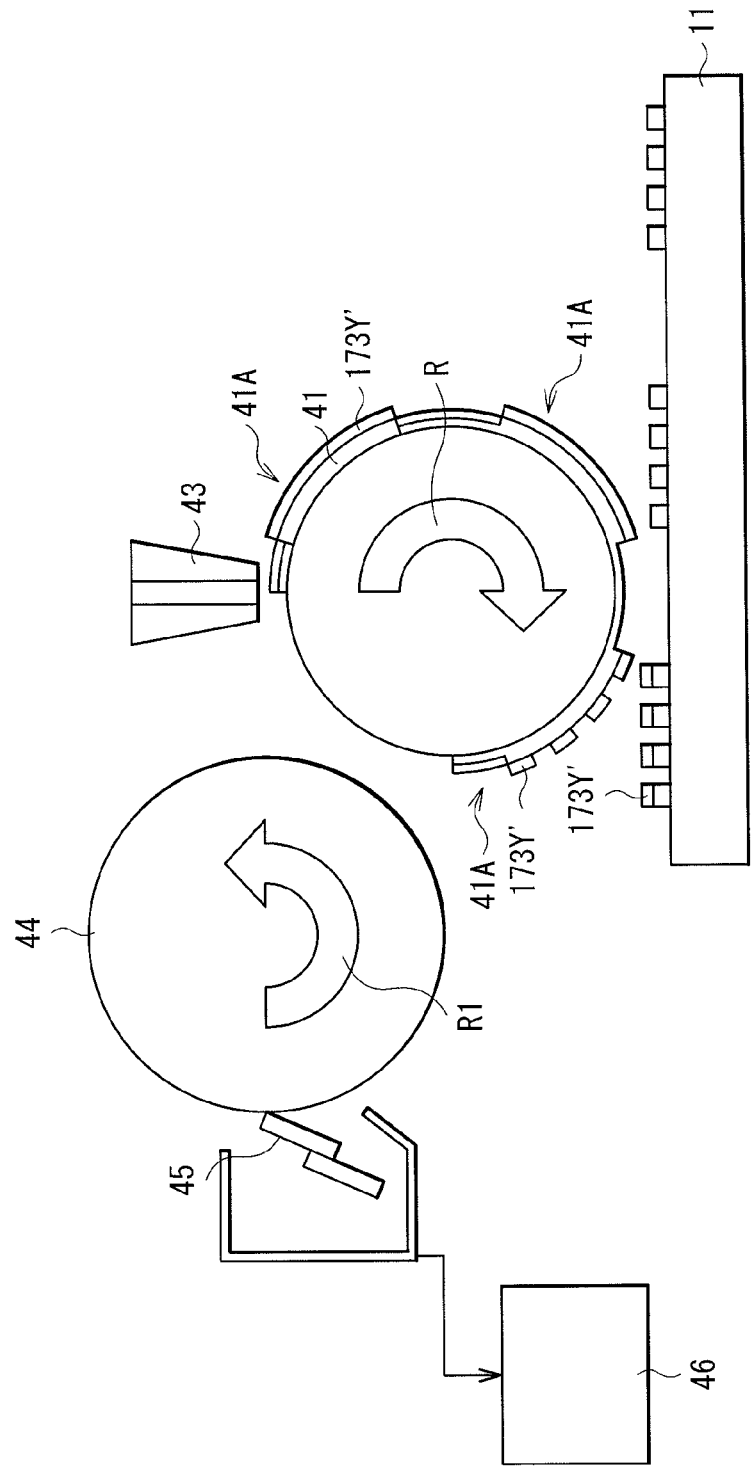
FIG. 16 is a sectional view illustrating a modification of the steps illustrated in FIG. 14.

As a method of inhibiting transfer to the region other than the display region 110, as illustrated in FIG. 16, a projection 41A may be provided on the blanket 41. The projection 41A is provided in a position facing the display region 110, and only a portion on the projection 41A of the yellow light-emitting film 173Y' is brought into contact with the substrate 11. Therefore, transfer of the yellow light-emitting film 173Y' to the region other than the display region 110 is inhibited. The projection 41A may to be formed, for example, by molding silicon rubber on the surface of the blanket 41.

(Step of Forming Blue Light-Emitting Layer 173B)

After the yellow light-emitting layer 173Y is formed, the blue light-emitting layer 173B is formed (step S17 in FIG. 5). The blue light-emitting layer 173B is formed on entire surfaces of the yellow light-emitting layer 173Y, and the hole transport layer 172 of the blue organic EL device 10B by, for example, an evaporation method.

(Step of Forming Electron Transport Layer 174, Electron Injection Layer 175, and Upper Electrode 18)

After the blue light-emitting layer 173B is formed, the electron transport layer 174, the electron injection layer 175, and the upper electrode 18 which are made of the above-described materials are formed on an entire surface of the blue light-emitting layer 173B by, for example, an evaporation method (steps S18, S19, and S20).

After the upper electrode 18 is formed, as illustrated in FIG. 4, the protective layer 19 is formed by, for example, an evaporation method or a CVD method. At this time, to prevent a decline in luminance caused by deterioration in the yellow light-emitting layer 173Y, the blue light-emitting layer 173B, or the like, a film formation temperature is preferably set to a room temperature, and to prevent peeling of the protective layer 19, film formation is preferably performed under condition that stress of a film be minimized.

The blue light-emitting layer 173B, the electron transport layer 174, the electron injection layer 175, the upper electrode 18, and the protective layer 19 are formed in a region including the display region 110 with use of a so-called area mask. Moreover, the blue light-emitting layer 173B, the electron transport layer 174, the electron injection layer 175, the upper electrode 18, and the protective layer 19 are preferably formed sequentially in one film formation unit without being exposed to air, since deterioration caused by moisture in the air is prevented.

After the protective layer 19 is formed, the sealing substrate 21 is bonded onto the protective layer 19 with the adhesive layer 22 in between. Thus, the display 1 illustrated in FIGS. 1 to 4 is completed.

[Functions and Effects of Display 1]

In the display 1, a scanning signal is supplied from the scanning line drive circuit 130 to each pixel through a gate electrode of the writing transistor Tr2, and an image signal supplied from the signal line drive circuit 120 through the writing transistor Tr2 is retained in the retention capacitor Cs. In other words, on-off control of the driving transistor Tr1 is performed in response to the signal retained in the retention capacitor Cs, and a drive current Id is thereby injected into each of the red organic EL devices 10R, the green organic EL devices 10G, and the blue organic EL devices 10B to emit light by the recombination of holes and electrons. The light passes through the lower electrodes 15, the substrate 11, and the color filter (not illustrated), and then the light is extracted.

At this time, the common yellow light-emitting layer 173Y and the common blue light-emitting layer 173B are provided for the red organic EL devices 10R and the green organic EL devices 10G. However, as light passes through different color filters (not illustrated), red light (with a wavelength of 620 nm to 750 nm) and green light (with a wavelength of 495 nm to 570 nm) are extracted from the red organic EL devices 10R and the green organic EL devices 10G, respectively. As the blue organic EL devices 10B each include only the blue light-emitting layer 173B, the blue organic EL devices 10B emit blue light (with a wavelength of 450 nm to 495 nm).

In the display 1 according to the embodiment, the level difference 14S is formed by a difference between the thickness d1 of the first region R1 and the thickness d2 of the second region R2 in the planarization insulating film 14; therefore, even if the yellow light-emitting film 173Y' on the blanket 41 has a solid film form, the yellow light-emitting film 173Y' is not transferred to the blue organic EL devices 10B. Therefore, the yellow light-emitting layer 173Y is allowed to be formed only in the red organic EL devices 10R and the green organic EL devices 10G without use of the plate (for example, the plate 49). In other words, the yellow light-emitting layer 173Y is allowed to be formed while high film thickness accuracy which is an advantage of the reverse offset printing method is maintained and cost is reduced by eliminating the step of cleaning the plate.

Moreover, in the embodiment, the step of cleaning the blanket 41 (refer to FIG. 13) is necessary; however, the yellow light-emitting film 173Y' remaining on the blanket 41 is allowed to be removed by a simple cleaning mechanism by rotating the roll 42 and the cleaning roll 44. In the cleaning mechanism, an organic material collected in the tank 46 is reusable; therefore, the cleaning mechanism is superior in terms of ecology. Further, when the preprocessing roll 49 (refer to FIG. 14) is provided or when the projection 41A is provided on the blanket 41 (refer to FIG. 16), a step of removing the yellow light-emitting film 173Y' adhered to the region other than the display region 110 after transfer is allowed to be eliminated, and operation time is allowed to be further reduced accordingly.

Modifications of the embodiment and other embodiments will be described below. In the following description, like components are denoted by like numerals as of the above-described embodiment and will not be further described.

Modification 1

Figure 17:
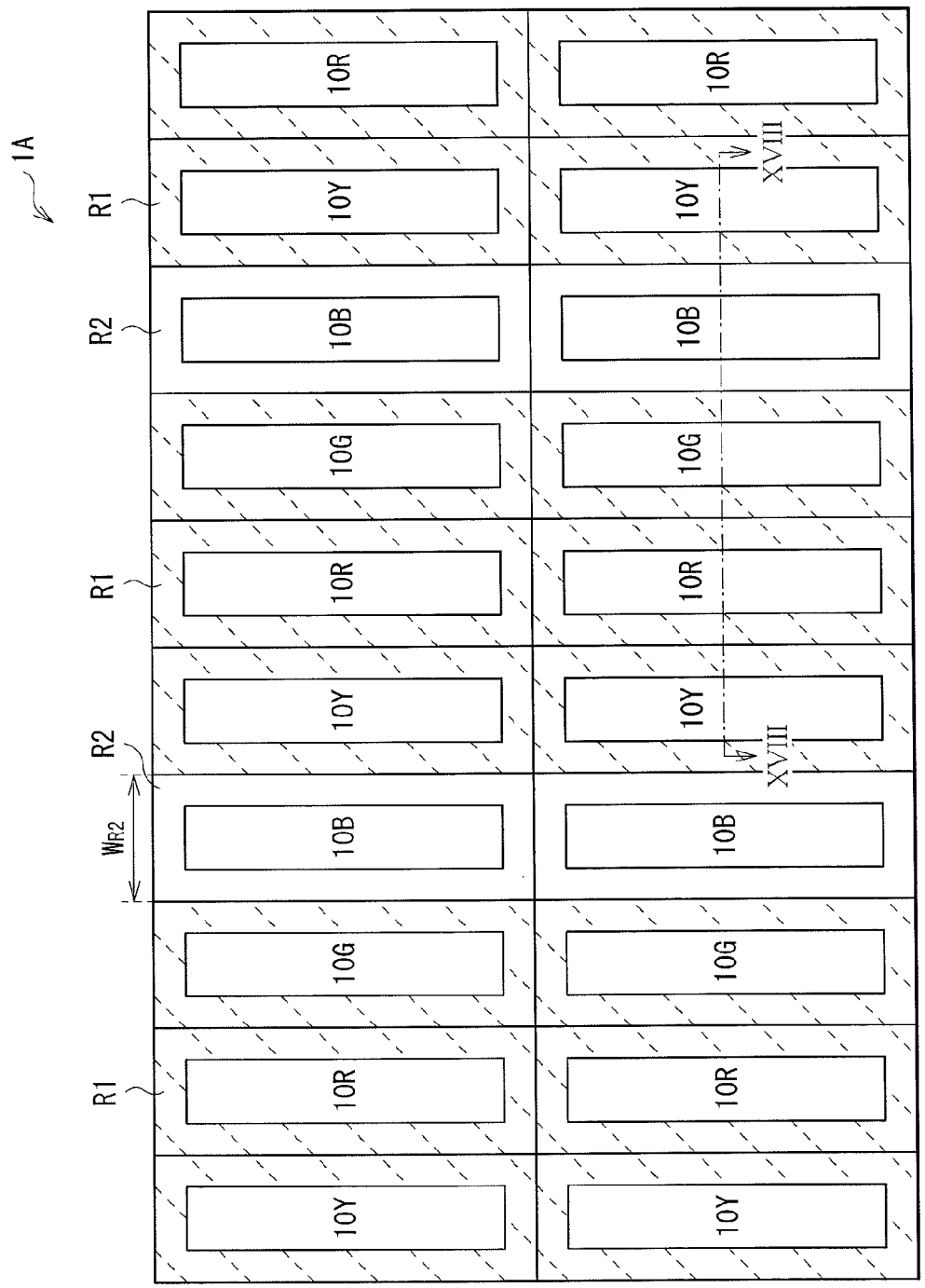
FIG. 17 is a plan view illustrating a configuration of a display according to Modification 1 of the technology.
Figure 18:
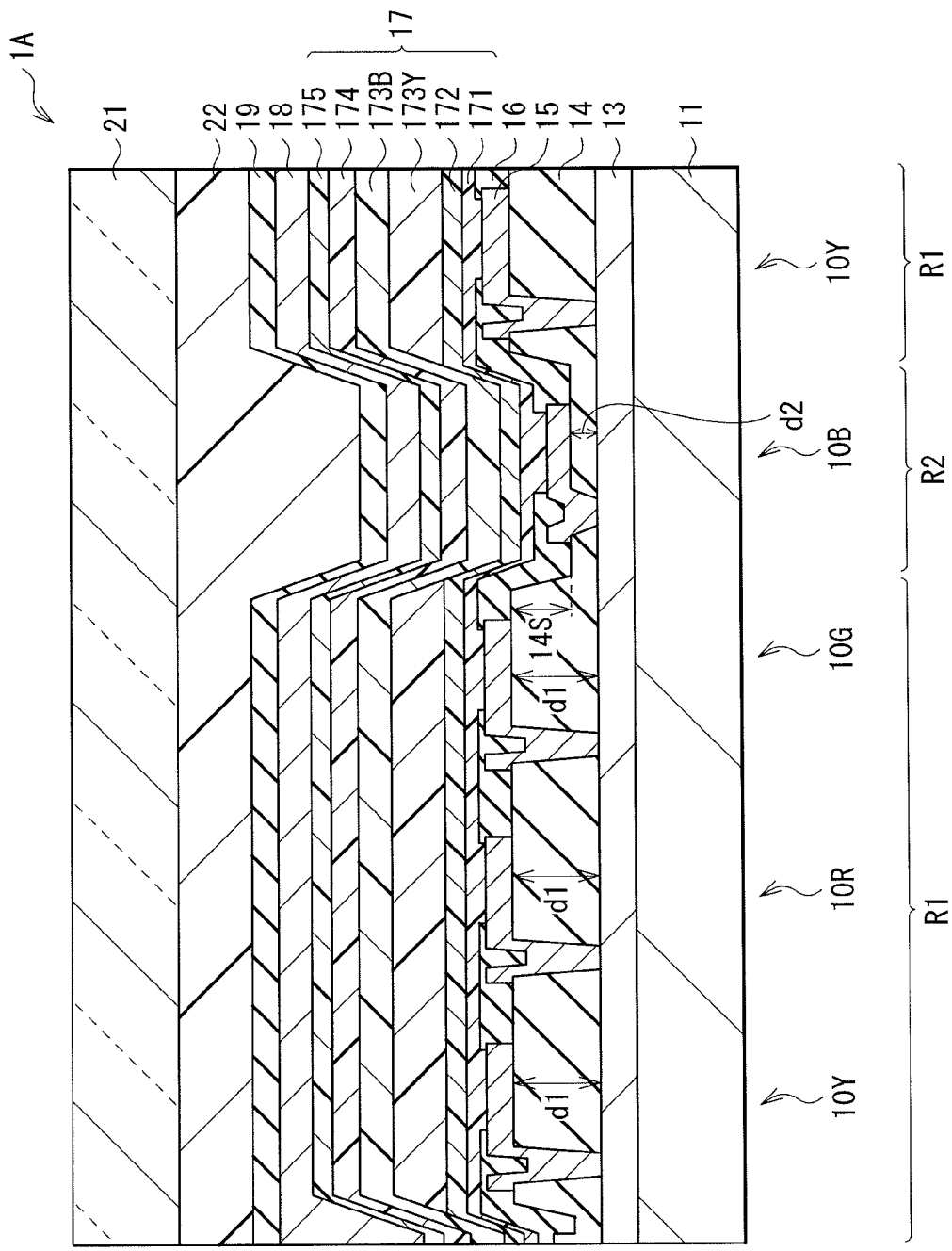
FIG. 18 is a sectional view taken along a line XVIII-XVIII of FIG. 17.

FIG. 17 illustrates a planar configuration of the display region 110 of a display (a display 1A) according to Modification 1 of the above-described embodiment. FIG. 18 illustrates a sectional configuration taken along a line XVIII-XVIII of FIG. 17. The display 1A is different from the display 1 in that yellow organic EL devices 10Y are included in addition to the red organic EL devices 10R, the green organic EL devices 10G, and the blue organic EL devices 10B.

The yellow organic EL devices 10Y each have a configuration similar to that of the red organic EL devices 10R and the green organic EL devices 10G, and include the yellow light-emitting layer 173Y and the blue light-emitting layer 173B as light-emitting layers. As light passes through a yellow filter (not illustrated) located closer to the substrate 11, yellow light (with a wavelength of 570 nm to 590 nm) is extracted from the yellow organic EL devices 10Y.

As the display 1A includes the red organic EL devices 10R, the green organic EL devices 10G, the blue organic EL devices 10B, and the yellow organic EL devices 10Y, power consumption is allowed to be reduced for the following reason.

As colors typically appearing on a television, white has highest appearance frequency, and a color close to a black body radiation line connecting blue and yellow (more specifically, a skin color) has second highest appearance frequency, and these colors are virtually represented by two colors, i.e., blue and yellow. In other words, colors with high appearance frequency are represented by a smaller number of devices; therefore, power consumption is allowed to be reduced in the display 1A. Moreover, as light emission efficiency of blue and yellow is high, power consumption is allowed to be further reduced.

Modification 2

Figure 19:
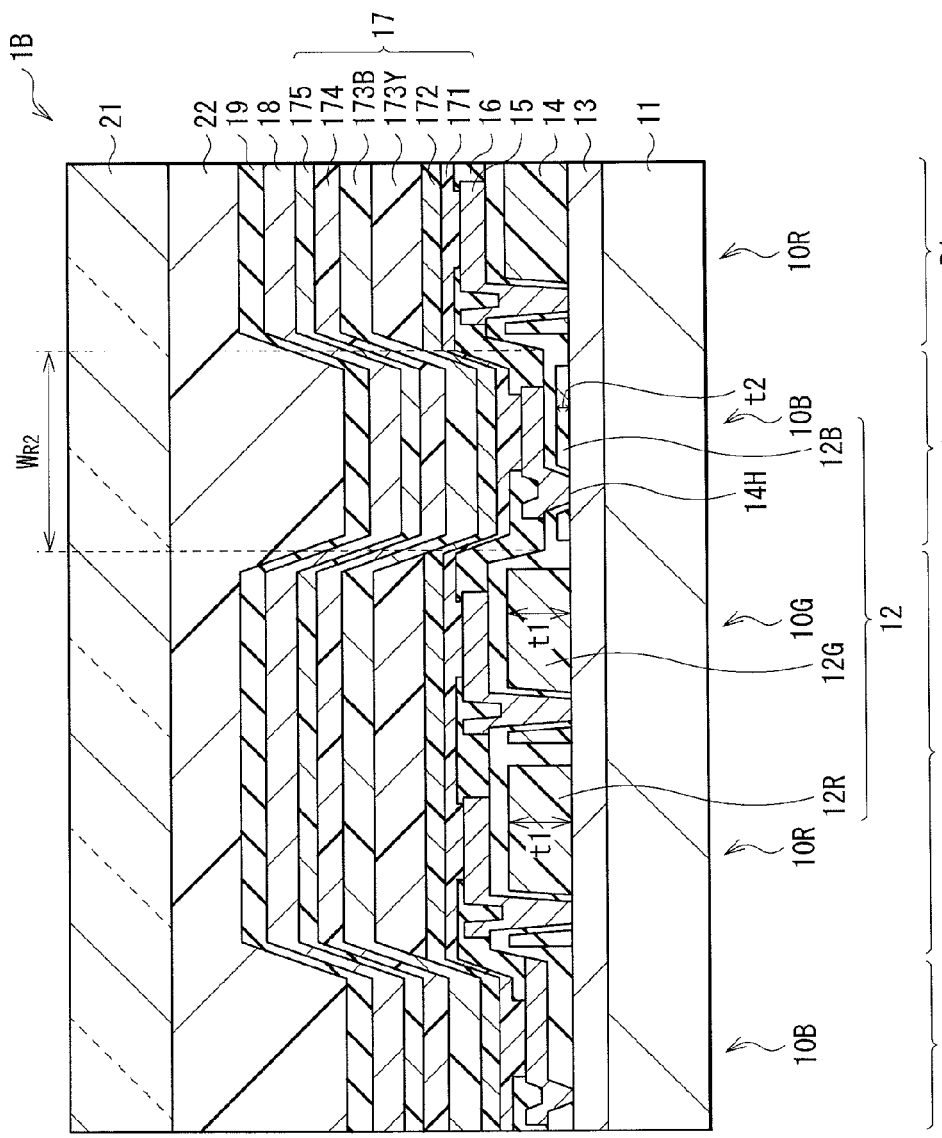
FIG. 19 is a sectional view illustrating a configuration of a display according to Modification 2 of the technology.

FIG. 19 illustrates a sectional configuration of a display (a display 1B) according to Modification 2 of the above-described embodiment. The display 1B is different from the display 1 in that a level difference between the first region R1 and the second region R2 is formed by a color filter 12. The color filter 12 is, for example, an on-chip color filter, and includes red filters 12R, green filters 12G, and blue filters 12B. The color filter 12 is disposed between the TFT layer 13 and the planarization insulating film 14.

The red filters 12R, the green filters 12G, and the blue filters 12B face the red organic EL devices 10R, the green organic EL devices 10G, and the blue organic EL device 10B, respectively. The level difference (t1−t2) is formed by a difference (t1>t2) between a thickness t1 of the red filters 12R and the green filters 12G (first color filters) and a thickness t2 of the blue filters 12B (second color filters). As in the case of the above-described embodiment, the level difference (t1−t2) is preferably $\frac{1}{100}$ or over of the width $W_{R2}$ of the second region R2, and more preferably 500 nm or over.

The color filter 12 is formed by repeating a photolithography step three times with use of so-called pigment dispersion type resist materials of red, green, and blue. In this case, the blue filters 12B are formed to have a smaller thickness t2 than the thickness t1 of the red filters 12R and the green filters 12G to form the level difference (t1−t2).

Thus, a step of forming the level difference in the planarization insulating film 14 (refer to FIG. 6) is eliminated, and another color filter (for example, a color filter substrate) is not necessary; therefore, cost is allowed to be further reduced.

Figure 20:
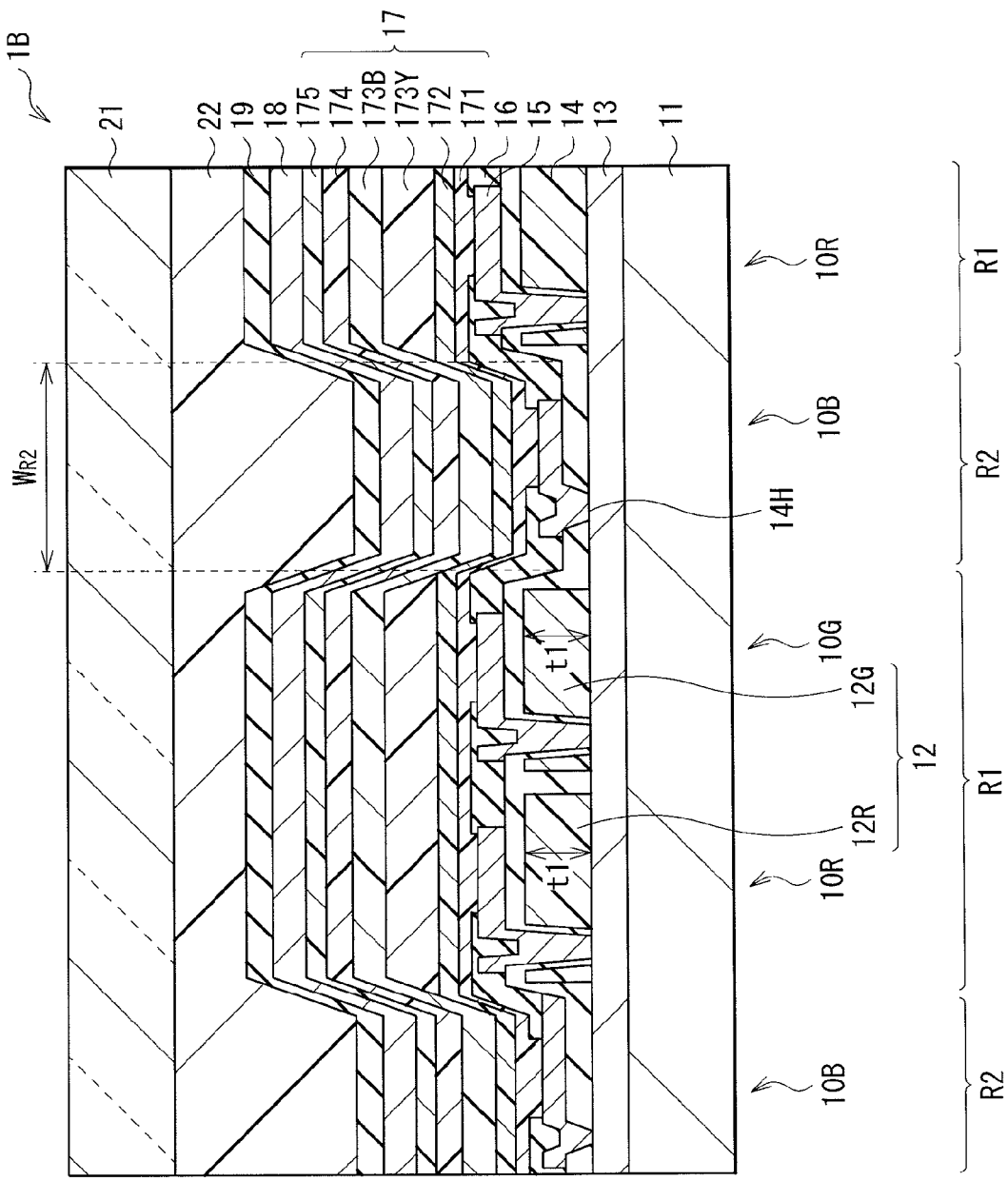
FIG. 20 is a sectional view illustrating a modification of the display illustrated in FIG. 19.

Moreover, as illustrated in FIG. 20, the blue filters 12B may not be provided, and a level difference t1 may be formed only by the thickness t1 of the red filters 12R and the green filters 12G. In this case, one lithography step for forming the blue filters 12B is eliminated; therefore, compared to the display in FIG. 19, cost is allowed to be further reduced.

Figure 21:
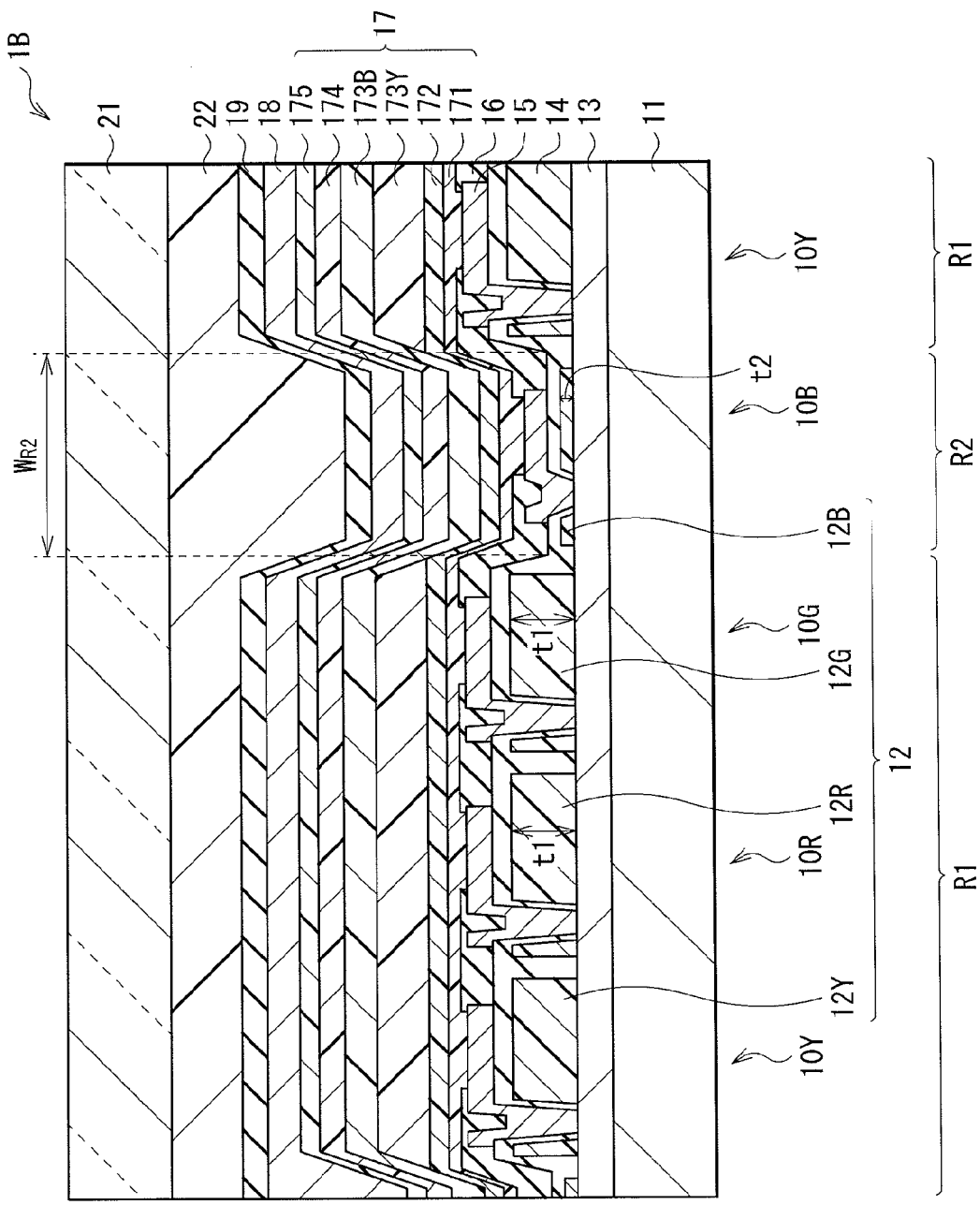
FIG. 21 is a sectional view illustrating another modification of the display illustrated in FIG. 19.

As illustrated in FIG. 21, the display 1B may include the yellow organic EL devices 10Y and yellow filters 12Y with the thickness t1 disposed to face the yellow organic EL devices 10Y, respectively.

Second Embodiment

Figure 22:
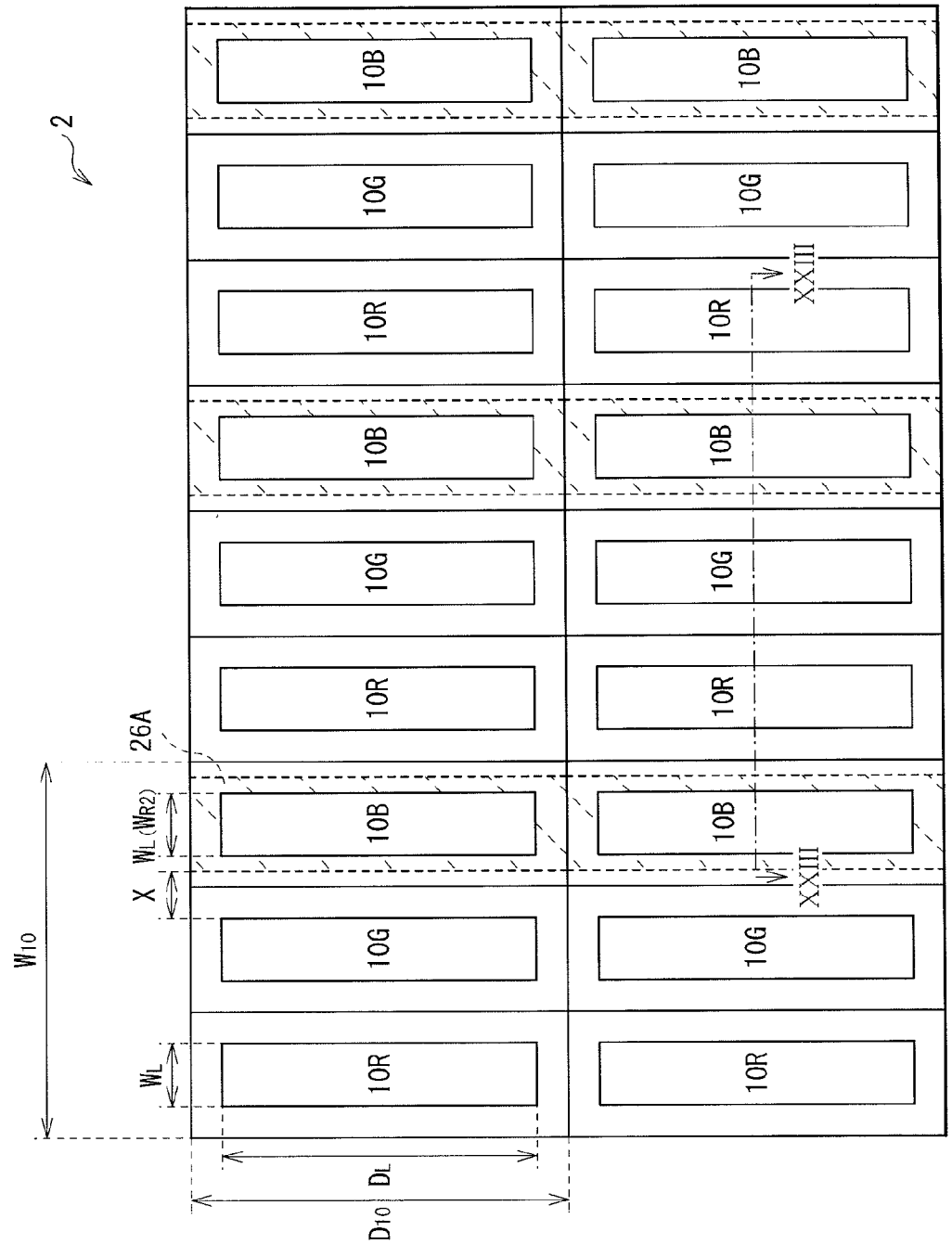
FIG. 22 is a plan view illustrating a configuration of a display according to a second embodiment of the technology.
Figure 23:
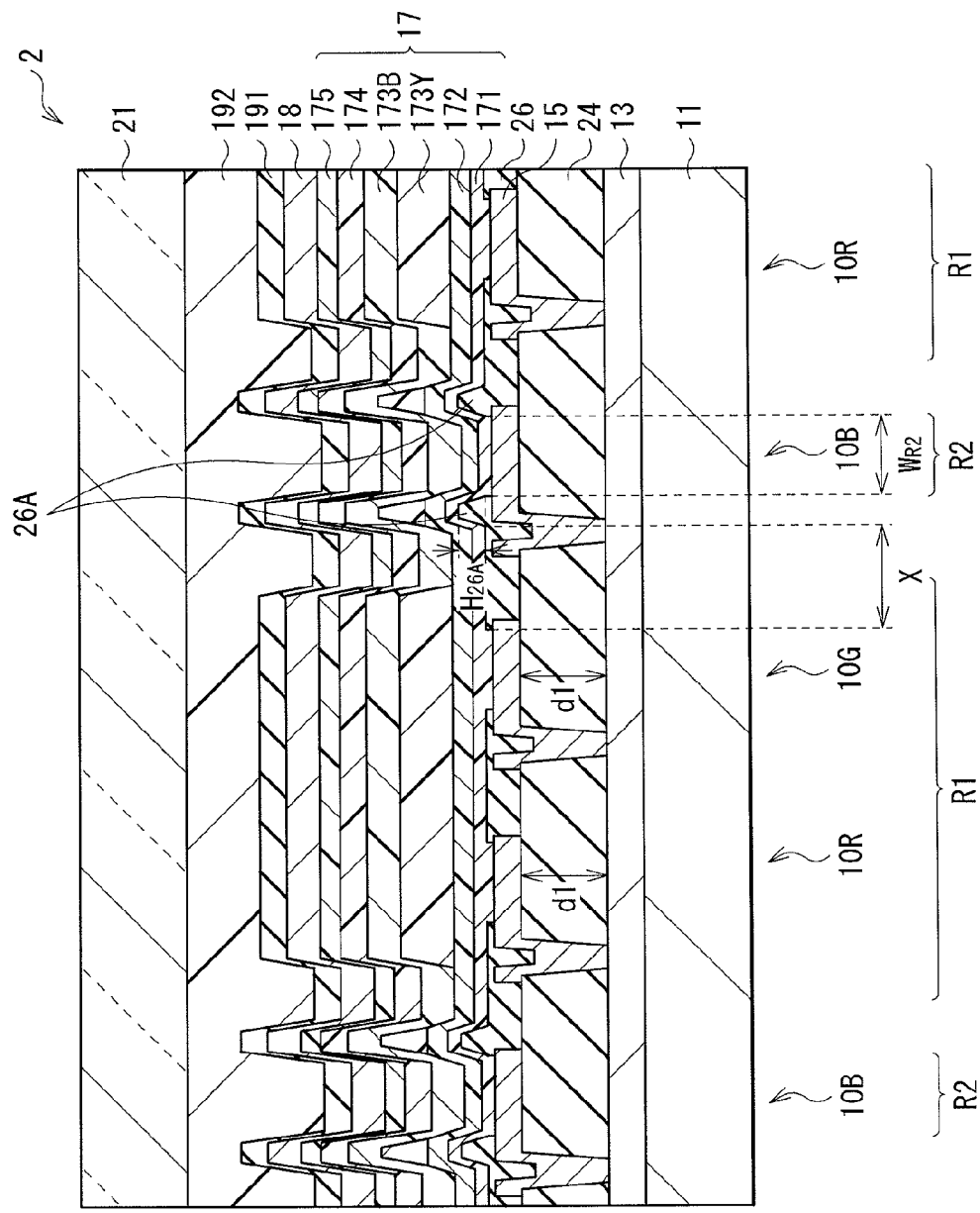
FIG. 23 is a sectional view taken along a line XXIII-XXIII of FIG. 22.

FIG. 22 illustrates a planar configuration of the display region 110 of a display (a display 2) according to a second embodiment of the technology, and FIG. 23 illustrates a sectional configuration taken along a line XXIII-XXIII of FIG. 22. In the display 2, a level difference is provided between the first region R1 and the second region R2 by a rib 26A (a projection) of an opening insulating film 26.

The opening insulating film 26 has openings corresponding to light emission regions of the red organic EL devices 10R, the green organic EL devices 10G, and the blue organic EL devices 10B. The rib 26A is provided only around each of the openings corresponding to the blue organic EL devices 10B in the opening insulating film 26. Therefore, a level difference equal to a height $H_{26A}$ of the rib 26A is formed between each of regions (first regions R1) where the red organic EL devices 10R and the green organic EL devices 10G are formed and each of regions (second regions R2) where the blue organic EL devices 10B are formed. In the embodiment, the second regions R2 correspond to light emission regions of the blue organic EL device 10B (the openings of the opening insulating film 26).

Although the rib 26A is disposed entirely around each of the openings corresponding to the blue organic EL devices 10B (refer to FIG. 22), the rib 26A may be disposed in only a pair of positions facing each other with the blue organic EL device 10B in between. The height $H_{26A}$ of the rib 26A is preferably 1/100 or over of the width $W_{R2}$ of the second region R2 (the width $W_L$ of the opening of the opening insulating film 26), and more preferably 500 nm or over to inhibit contact. For example, in the case where the width $W_{10}$ of the pixel 10 and the length $D_{10}$ of the pixel 10 (the pith of the pixel 10) are 360 µm, and the width $W_{R2}$ of the second region R2 is 60 µm, when the height $H_{26A}$ of the rib 26A is 2 µm, contact of the blanket with the regions where the blue organic EL devices 10B are formed is sufficiently inhibited.

Figure 24:
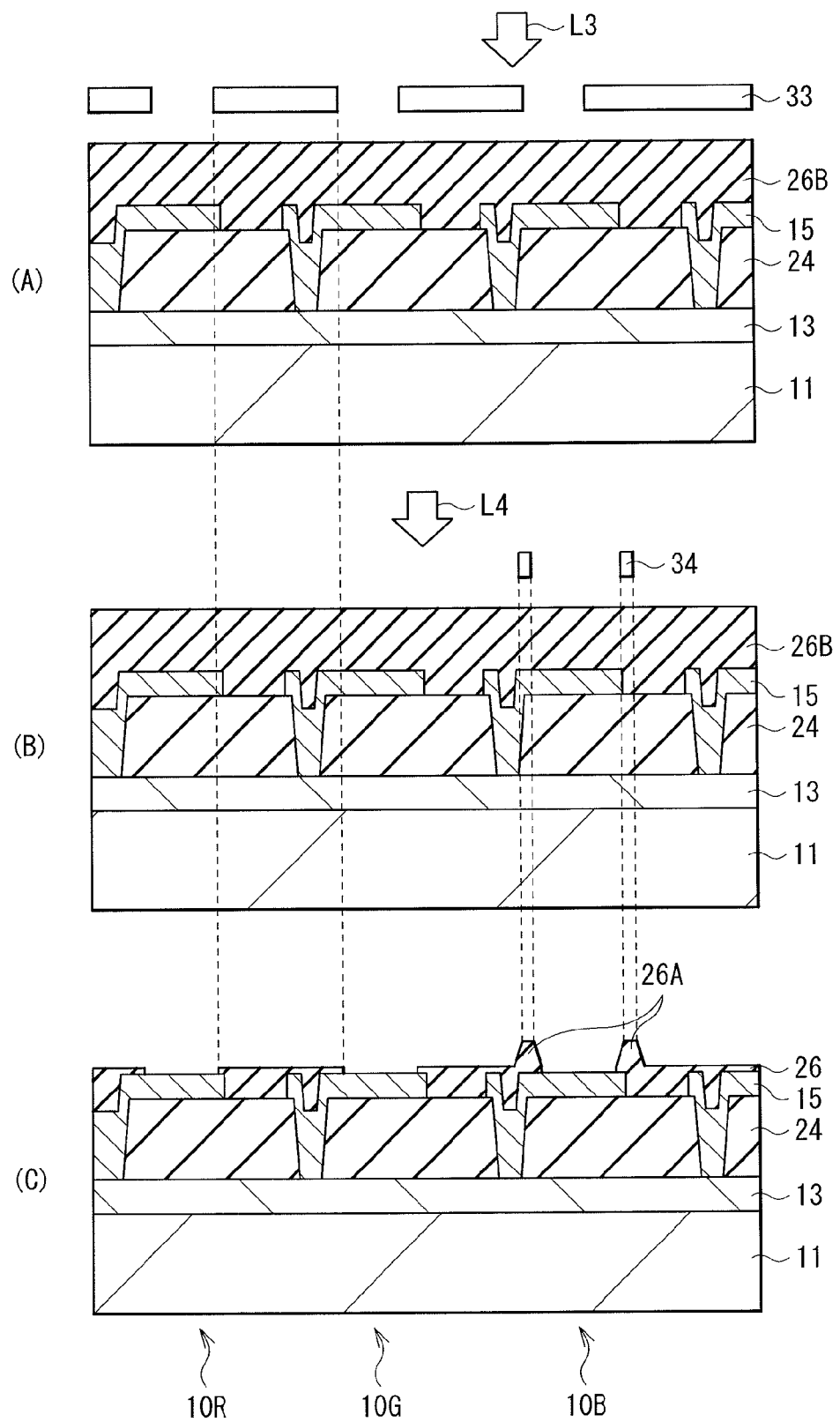
FIG. 24 is a sectional view illustrating a method of forming an opening insulating film illustrated in FIG. 23.

FIG. 24 illustrates a step of forming the rib 26A. After the lower electrode 15 is formed, an entire surface of the substrate 11 is covered with an insulating film 26B made of, for example, polyimide. Next, the insulating film 26B is covered with a mask 33 and is exposed to light (L3) (refer to a part (A) in FIG. 24). Regions other than desired light emission regions (openings of the opening insulating film 26) of the red organic EL devices 10R, the green organic EL devices 10G, and the blue organic EL devices 10B of the insulating film 26B are covered with the mask 33. Next, only regions where the ribs 26A are supposed to be formed of the insulating film 26B are covered with a mask 34, and the insulating film 26B is half-exposed to light (L4) (a part (B) in FIG. 24), and development is performed on the insulating film to form the opening insulating film 26 with the ribs 26A (refer to a part (C) in FIG. 24).

Figure 25:
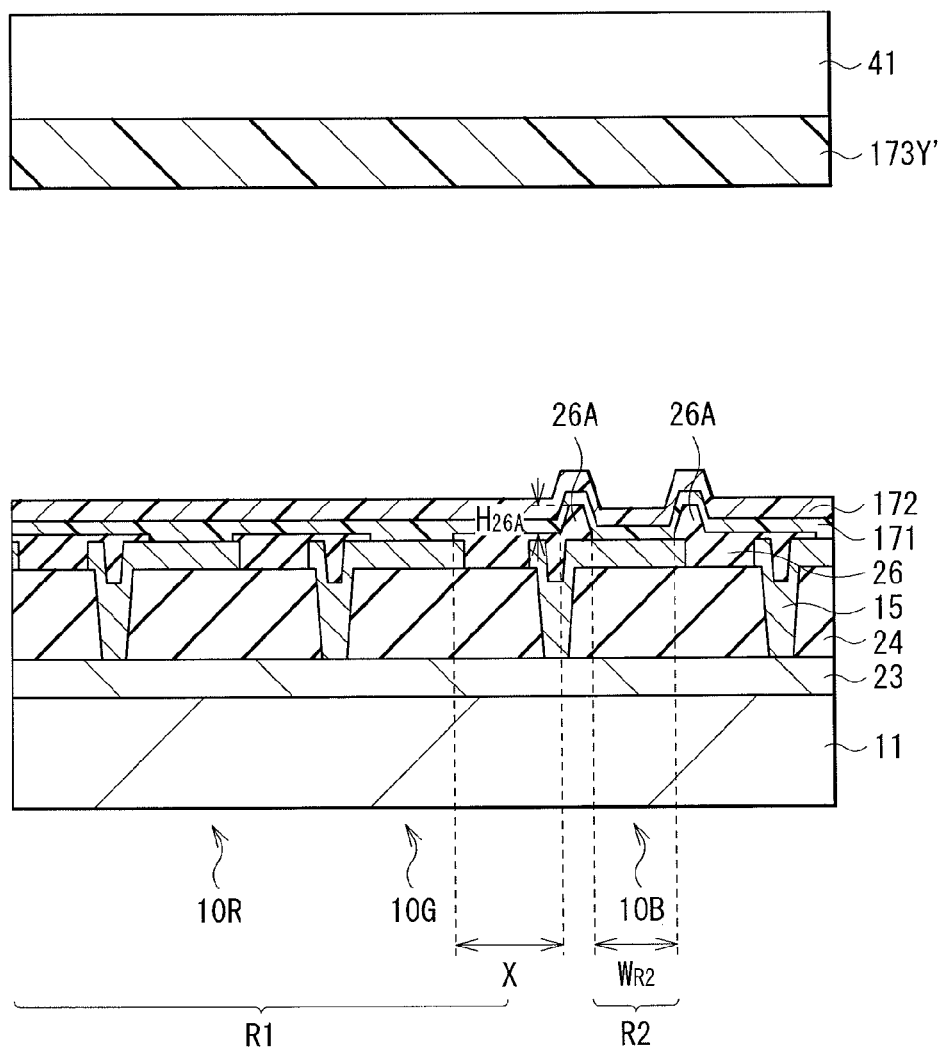
FIG. 25 is a sectional view illustrating a step following FIG. 24.

In the embodiment, when the yellow light-emitting layer 173Y is formed, a level difference is formed between each of the regions (the first regions R1) corresponding to the red organic EL devices 10R and the green organic EL devices 10G and each of the regions (the second regions R2) corresponding to the blue organic EL devices 10B by the rib 26A around the opening of each of the blue organic EL devices 10B. Therefore, as illustrated in FIG. 25, when the blanket 41 is brought into contact with the substrate 11, the yellow light-emitting film 173Y' comes into contact with the regions corresponding to the red organic EL devices 10R and the green organic EL devices 10B of the hole transport layer 172, and on the other hand, gaps are formed between the yellow light-emitting film 173Y' and the regions (the openings of the opening insulating film 26) corresponding to the blue organic EL devices 10B of the hole transport layer 172. A distance between the green organic EL device 10G (or the red organic EL device 10R) and the blue organic EL device 10B which are adjacent to each other is preferably large enough not to inhibit contact of the blanket 41 with the red organic EL devices 10R and the green organic EL devices 10G. More specifically, a distance X (refer to FIGS. 22 and 23) between the rib 26A of the opening insulating film 26 and the opening of each green organic EL device 10G is preferably 10 or more times as large as the height $H_{26A}$ of the rib 26A. For example, when the height $H_{26A}$ is 2 µm, the distance X is 50 µm. If possible, the distance X may be 100 or more times as large as the height $H_{26A}$.

Modification 3

Figure 26:
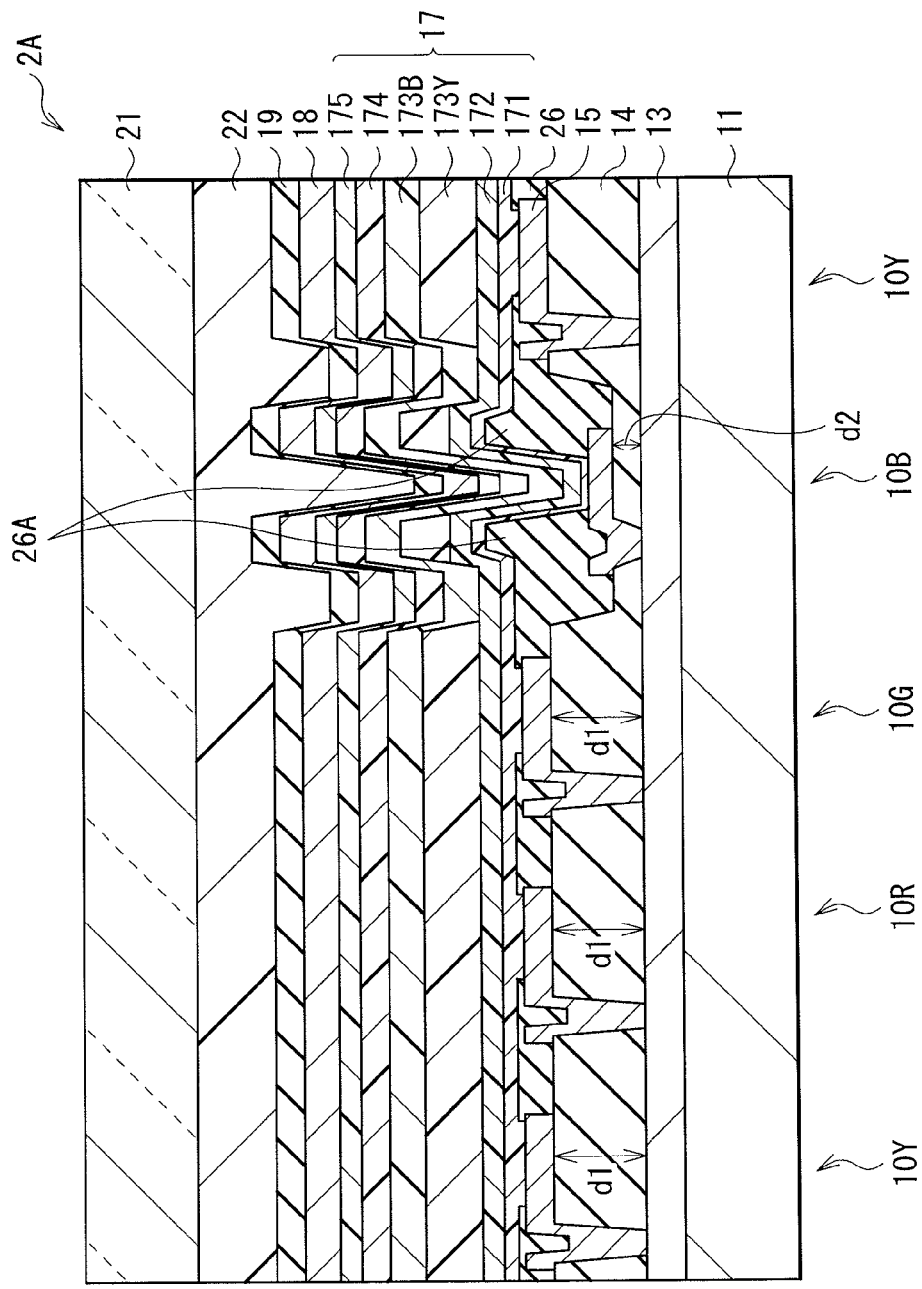
FIG. 26 is a sectional view illustrating a configuration of a display according to Modification 3 of the technology.

As illustrated in FIG. 26, in a display (a display 2A) according to Modification 3 of the above-described embodiment, the opening insulating film 26 includes the rib 26A, and the planarization insulating film 14 has the level difference 14S.

When the level difference 14S is provided by only the thicknesses d1 and d2 of the planarization insulating film 14 (refer to FIG. 4), it is necessary to increase the level difference 14S (d1−d2) to reliably inhibit contact of the blanket 41 with the blue organic EL devices 10B. In particular, when the roll 42 is used, high pressure is applied, and a difference between the thicknesses d1 and d2 is increased to cause an increase in a distance between light emission sections of the red organic EL devices 10R and the green organic EL devices 10G and the color filter (not illustrated). Therefore, light emitted from the red organic EL device 10R and light emitted from the green organic EL device 10G may not pass through the red filter and the green filter, respectively, but may pass through different filters to cause color mixture, thereby causing a decline in panel quality.

On the other hand, in the display 2A, in addition to the level difference 14S by the thicknesses d1 and d2 of the planarization insulating film 14, a level difference by the rib 26A is provided; therefore, a distance between the light emission section of the red organic EL device 10R and the red filter and a distance between the green organic EL device 10G and the green filter are allowed to be reduced, thereby suppressing color mixture. When the width $W_L$ of the opening is approximately 60 µm, for example, a difference (the level difference 14S) between the thicknesses d1 and d2 of the planarization insulating film 14 is 3 µm, and the height $H_{26A}$ of the rib 26A is 2 µm.

Modification 4

Figure 27:
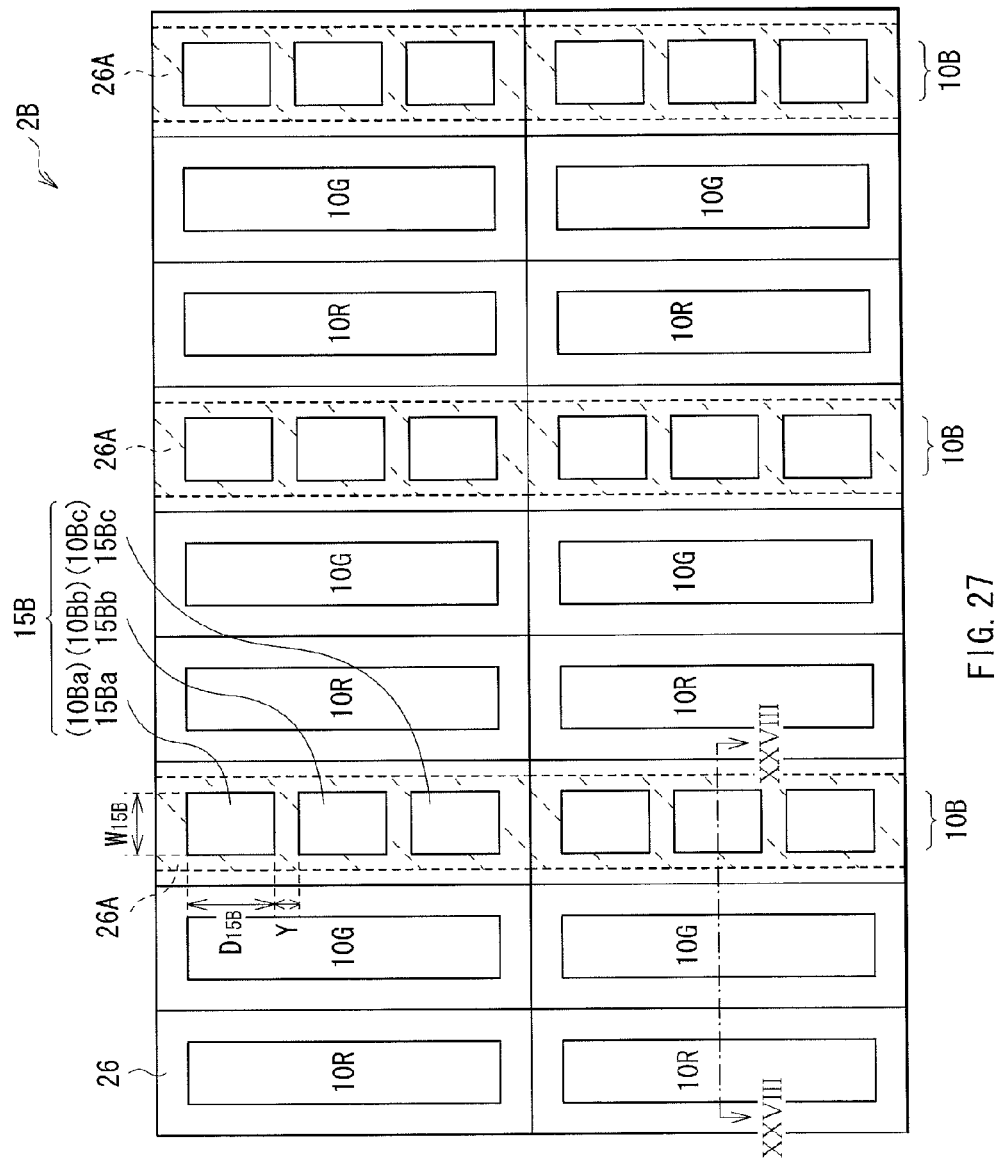
FIG. 27 is a plan view illustrating a configuration of an opening insulating film of a display according to Modification 4 of the technology.
Figure 28:
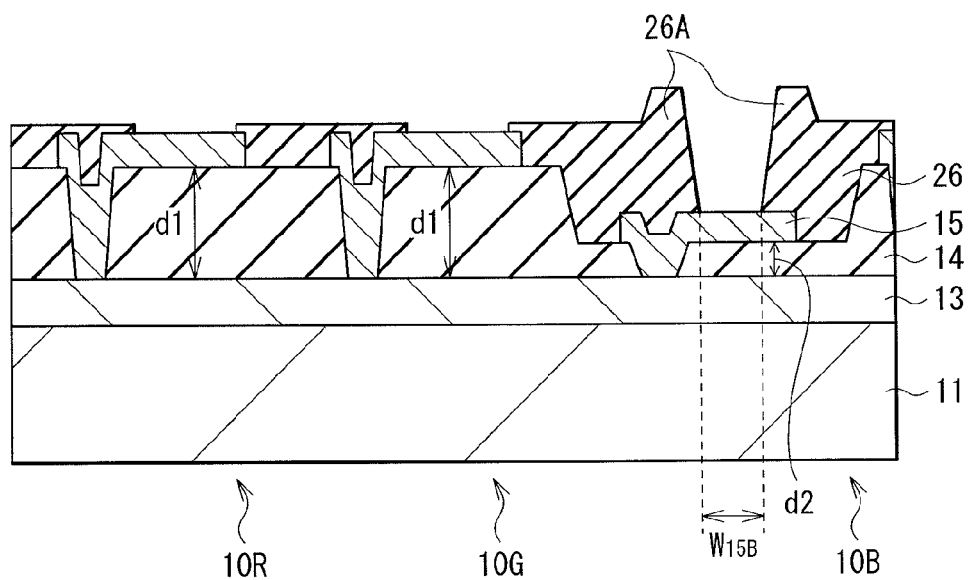
FIG. 28 is a sectional view taken along a line XXVIII-XXVIII of FIG. 27.

As illustrated in FIG. 27, in a display (a display 2B) according to Modification 4 of the above-described embodiment, a surface of a lower electrode (a lower electrode 15B) in each blue organic EL device 10B is partitioned into two or more regions by the opening insulating film 26 (made of an insulating material). FIG. 28 illustrates a sectional configuration taken along a line XXVIII-XXVIII of FIG. 27.

The surface of the lower electrode 15B of the blue organic EL device 10B is partitioned into three regions 15Ba, 15Bb, and 15Bc, and an area of each of the three regions 15Ba, 15Bb, and 15Bc is smaller than an area of a surface of the lower electrode 15 in each of the red organic EL devices 10R and the green organic EL devices 10G. In other words, the light emission region of each blue organic EL device 10B is configured of three regions 10Ba, 10Bb, and 10Bc with an area smaller than that of each of the red organic EL devices 10R and the green organic EL devices 10G. The rib 26A is disposed around each of the three regions 10Ba, 10Bb, and 10Bc.

The opening insulating film 26 (the rib 26A) is disposed each between the region 15Ba and the region 15Bb, and between the region 15Bb and the region 15Bc. In other words, the surface of the lower electrode 15B is partitioned into a plurality of regions by the opening insulating film 26. The surface of the lower electrode 15B may be partitioned into, for example, two regions or four or more regions. The regions 15Ba, 15Bb, and 15Bc each have a substantially rectangular shape with a length $D_{15B}$ of 85 μm and a width $W_{15B}$ ($W_L$) of 60 μm, and a distance Y each between the region 15Ba and the region 15Bb and between the region 15Bb and the region 15Bc is 12 μm. As the lower electrode 15B is partitioned by the opening insulating film 26 in such a manner, when the blanket 41 is brought into contact with the substrate 11 where layers up to the hole transport layer 172 are formed (refer to FIG. 25) in the step of forming the yellow light-emitting layer 173Y, contact of the blanket 41 with the blue organic EL devices 10B is inhibited even if the height of the rib 26A is reduced. More specifically, even if the height of the rib 26A is not large enough, the blanket 41 comes in contact with sections (regions where the opening insulating film 26 is disposed) partitioning the lower electrode 15 into the regions 15Ba, 15Bb, and 15Bc; therefore, contact of the blanket 41 with the blue organic EL devices 10Ba, 10Bb, and 10Bc is suppressed. It is to be noted that the lower electrode 15B is one electrode, and only the surface thereof is partitioned. Such a lower electrode 15B is formed by patterning of the opening insulating film 26.

Module and Application Examples

Figure 29:
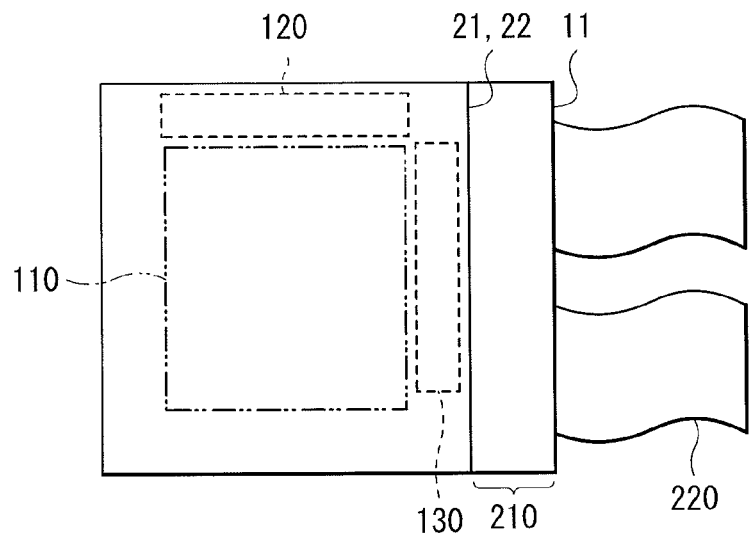
FIG. 29 is a plan view illustrating a schematic configuration of a module including the display according to any one of the above-described embodiments.

Application examples of the displays described in the above-described embodiments and the modifications thereof will be described below. The displays according to the above-described embodiments and the like are applicable to displays of electronic units displaying an image signal supplied from outside or an image signal produced inside as an image or a picture in any fields, such as televisions, digital cameras, notebook personal computers, portable terminal devices such as cellular phones, and video cameras.
(Module)
The display according to any one of the above-described embodiments and the like is incorporated into various electronic units such as Application Examples 1 to 5 which will be described later as a module as illustrated in FIG. 29. In the module, for example, a region 210 exposed from the protective layer 19 and the sealing substrate 21 is provided on a side of the substrate 11, and an external connection terminal (not illustrated) is formed in the exposed region 210 by extending the wiring of the signal line drive circuit 120 and the scanning line drive circuit 130. In the external connection terminal, a flexible printed circuit (FPC) 220 for signal input and output may be provided.

Application Example 1

Figure 30:
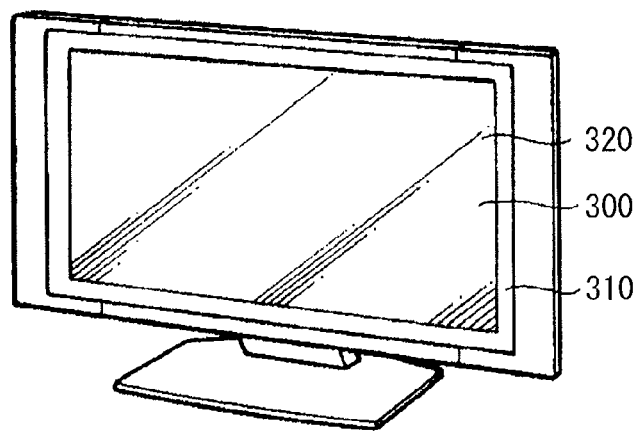
FIG. 30 is a perspective view illustrating an appearance of Application Example 1 of the display according to any one of the above-described embodiments.

FIG. 30 illustrates an appearance of a television to which the display according to any one of the above-described embodiments and the like is applied. The television includes, for example, an image display screen section 300 including a front panel 310 and a filter glass 320, and the image display screen section 300 is configured of any one of the displays 1, 1A, 1B, 2, 2A, and 2B according to the above-described embodiments and the like.

Application Example 2

Figure 31A:
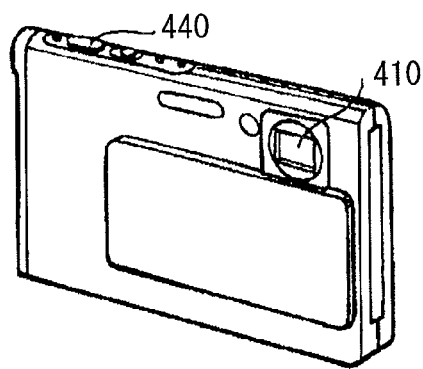
FIGS. 31A and 31B are perspective views illustrating an appearance of Application Example 2 from a front side and a back side, respectively.
Figure 31B:
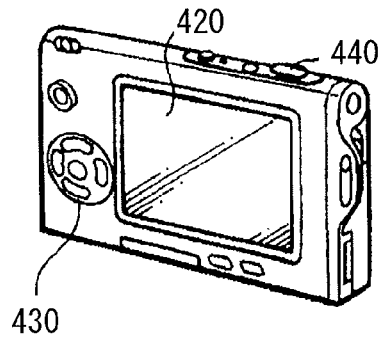

FIGS. 31A and 31B illustrate an appearance of a digital camera to which the display according to any one of the above-described embodiments and the like is applied. The digital camera includes, for example, a light-emitting section for a flash 410, a display section 420, a menu switch 430, and a shutter button 440, and the display section 420 is configured of any one of the displays 1, 1A, 1B, 2, 2A, and 2B according to the above-described embodiments and the like.

Application Example 3

Figure 32:
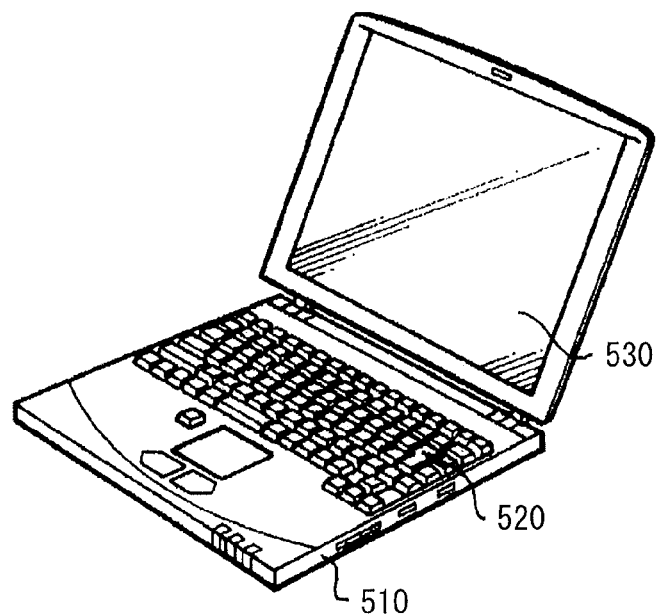
FIG. 32 is a perspective view illustrating an appearance of Application Example 3.

FIG. 32 illustrates an appearance of a notebook personal computer to which the display according to any one of the above-described embodiments and the like is applied. The notebook personal computer includes, for example, a main body 510, a keyboard 520 for operation of inputting characters and the like, and a display section 530 for displaying an image, and the display section 530 is configured of any one of the displays 1, 1A, 1B, 2, 2A, and 2B according to the above-described embodiments and the like.

Application Example 4

Figure 33:
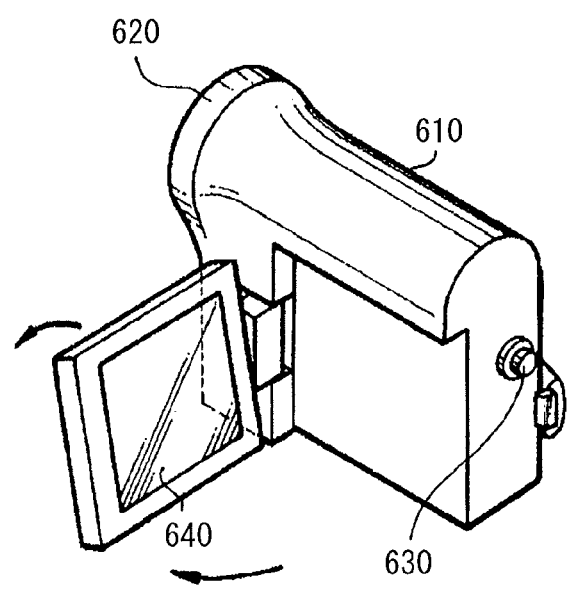
FIG. 33 is a perspective view illustrating an appearance of Application Example 4.

FIG. 33 illustrates an appearance of a video camera to which the display according to any one of the above-described embodiments and the like is applied. The video camera includes, for example, a main body 610, a lens for shooting an object 620 provided on a front surface of the main body 610, a shooting start/stop switch 630, and a display section 640, and the display section 640 is configured of any one of the displays 1, 1A, 1B, 2, 2A, and 2B according to the above-described embodiments and the like.

Application Example 5

FIGS. 34A to 34G illustrate an appearance of a cellular phone to which the display according to any one of the above-described embodiments and the like is applied. The cellular phone is formed by connecting, for example, a top-side enclosure 710 and a bottom-side enclosure 720 to each other by a connection section (hinge section) 730, and the cellular phone includes a display 740, a sub-display 750, a picture light 760, and a camera 770. The display 740 or the sub-display 750 is configured of any one of the displays 1, 1A, 1B, 2, 2A, and 2B according to the above-described embodiments and the like.

Although the present technology is described referring to the embodiments and the modifications, the technology is not limited thereto, and may be variously modified. For example, in the above-described embodiments and the like, an example in which the yellow light-emitting layer 173Y is made of a yellow light-emitting material is described; however, instead of the yellow light-emitting layer 173Y, a light-emitting layer made of a mixture of a red light-emitting material and a green light-emitting material may be formed. Moreover, the case where the transfer organic layer is the yellow light-emitting layer 173Y is described; however, the transfer organic layer may be any other light-emitting layer or an organic layer other than the light-emitting layers.

Moreover, for example, in the above-described embodiments, the active matrix display is described. However, the technology is applicable to a passive matrix display.

In addition, for example, in the above-described embodiments and the like, the case where the first electrode 15 and the second electrode 18 are an anode and a cathode, respectively, is described; however, the first electrode 15 and the second electrode 18 may be a cathode and an anode, respectively. Moreover, as a top-emission display, light may be extracted from a side closer to the sealing substrate 21.

Further, for example, the material and thickness of each layer, the method and conditions of forming each layer are not limited to those described in the above-described embodiments, and each layer may be made of any other material with any other thickness by any other method under any other conditions.

In addition, in the above-described embodiments, a three-primary-color display including red and green organic EL devices as organic EL devices (first organic EL devices) other than blue organic EL devices is described; however, the first organic EL devices may include one or more kinds, preferably two or more kinds of organic EL devices selected from the group consisting of the red organic EL devices, the green organic EL devices, the yellow organic EL devices, and white organic EL devices. For example, the technology is applicable to a two-primary-color display including the blue organic EL devices and the yellow organic EL devices.

It is to be noted that the technology is allowed to have the following configurations.

(1) A display including:
a first light-emitting device disposed in a first region on a substrate and including a transfer organic layer;
a second light-emitting device disposed in a second region adjacent to the first region on the substrate and not including a transfer organic layer; and
a level difference provided between the first region and the second region, and being large enough to inhibit transfer of the transfer organic layer to the second region when the transfer organic layer is formed in the first region.

(2) The display according to (1), further including:
a planarization insulating film between the substrate, and the first light-emitting device and the second light-emitting device,
in which the level difference is formed by a difference between a thickness d1 of the planarization insulating film in the first region and a thickness d2 of the planarization insulating film in the second region, the thickness d1 being larger than the thickness d2.

(3) The display according to (1) or (2), further including:
a first color filter between the substrate and the first light-emitting device; and
a second color filter between the substrate and the second light-emitting device,
in which the level difference is formed by a difference between a thickness t1 of the first color filter and a thickness t2 of the second color filter, the thickness t1 being larger than the thickness t2.

(4) The display according to (1) or (2), further including:
a first color filter between the substrate and the first light-emitting device,
in which the level difference is formed by a thickness t1 of the first color filter.

(5) The display according to any one of (1) to (4), further including:
an opening insulating film, on the substrate, having openings corresponding to light emission regions of the first light-emitting device and the second light-emitting device,
in which the opening insulating film has a rib around the opening corresponding to the second light-emitting device, the rib forming the level difference.

(6) The display according to any one of (1) to (5), in which a surface of an electrode of the second light-emitting device is partitioned by an insulating material into two or more regions.

(7) The display according to any one of (1) to (6), in which the transfer organic layer is a first light-emitting layer, and a second light-emitting layer is included in the first light-emitting device and the second light-emitting device as a common layer.

(8) The display according to (7), in which
the first light-emitting layer is a yellow light-emitting layer, and
the second light-emitting layer is a blue light-emitting layer.

(9) The display according to (8), in which
the first light-emitting device is configured of two or more devices including the transfer organic layer as a common layer, and includes color filters of different colors facing the devices, respectively.

(10) The display according to (9), in which
the first light-emitting device emits yellow light, red light, and green light by separating light emitted from the first light-emitting device by the color filters into three colors, and
the second light-emitting device emits blue light.

(11) A method of manufacturing a display including:
forming a level difference between a first region and a second region on a substrate, the level difference being large enough to allow contact of a blanket with the first region and inhibit contact of the blanket with the second region; and
transferring an organic film on the blanket, with use of the level difference, to the first region but not to the second region.

(12) The method of manufacturing a display according to (11), further including:
cleaning off the organic film remaining on the blanket after the transferring of the organic film to the first region.

(13) An electronic unit including a display, the display including:
a first light-emitting device disposed in a first region on a substrate and including a transfer organic layer;
a second light-emitting device disposed in a second region adjacent to the first region on the substrate and not including a transfer organic layer; and
a level difference provided between the first region and the second region, and being large enough to inhibit transfer of the transfer organic layer to the second region when the transfer organic layer is formed in the first region.

It should be understood by those skilled in the art that various modifications, combinations, sub-combinations, and alterations may occur depending on design requirements and other factors insofar as they are within the scope of the appended claims or the equivalents thereof

What is claimed is:

1. A method of manufacturing a display comprising:
    forming a level difference between a first region and a second region on a substrate, wherein the level difference includes a difference between a thickness of a material disposed in the first region on the substrate and a thickness of a material disposed in the second region on the substrate and the level difference is large enough to allow contact of a blanket with the first region and inhibit contact of the blanket with the second region; and
    transferring an organic film on the blanket, with use of the level difference, from the blanket to the first region but not to the second region.

2. The method of manufacturing a display according to claim 1, further comprising:
    removing the organic film remaining on the blanket after the transferring of the organic film to the first region during a cleaning process.

3. The method of manufacturing a display according to claim 2, further comprising:
    transferring the organic film remaining on the blanket to a cleaning roll; and
    scraping off the organic film on the cleaning roll utilizing a cleaning blade.

4. The method of manufacturing a display according to claim 1, wherein the material is a planarization insulating film.

5. The method of manufacturing a display according to claim 4, wherein the level difference is formed by a difference between a thickness d1 of the planarization insulating film in the first region and a thickness d2 of the planarization insulating film in the second region, the thickness d1 being larger than the thickness d2.

6. The method of manufacturing a display according to claim 1, wherein the organic film is a yellow light-emitting film.

7. The method of manufacturing a display according to claim 1, wherein the material is a color filter.

8. The method of manufacturing a display according to claim 1, further comprising:
   forming a first light-emitting device in the first region;
   forming a second light-emitting device in the second region adjacent to the first region, wherein the level difference provided between the first region and the second region includes a difference between a thickness of a material located between the substrate and the first light-emitting device and a thickness of a material disposed between the substrate and the second light-emitting device.

9. The method of manufacturing a display according to claim 1, further comprising:
   forming a first color filter between the substrate and a first light-emitting device; and
   forming a second color filter between the substrate and a second light-emitting device,
   wherein the level difference is formed by a difference between a thickness t1 of the first color filter and a thickness t2 of the second color filter, the thickness t1 being larger than the thickness t2.

10. The method of manufacturing a display according to claim 1, wherein the first region is associated with a green organic device and the second region is associated with a blue organic device.

* * * * *